United States Patent [19]

Takeshita et al.

[11] 4,191,924
[45] Mar. 4, 1980

[54] CHANNEL SELECTION APPARATUS

[75] Inventors: Masahiro Takeshita; Kazumi Kawashima; Minoru Ueda, all of Takatsuki; Keisuke Yamamoto, Ibaraki, all of Japan

[73] Assignee: Matsushita Electric Industrial Co., Ltd., Osaka, Japan

[21] Appl. No.: 908,539

[22] Filed: May 22, 1978

[30] Foreign Application Priority Data

| May 25, 1977 | [JP] | Japan | 52/61515 |
| Jun. 15, 1977 | [JP] | Japan | 52/71294 |
| Jun. 17, 1977 | [JP] | Japan | 52/72435 |

[51] Int. Cl.² .................................................. H04B 1/16
[52] U.S. Cl. ...................................... 325/465; 334/15
[58] Field of Search .............. 325/452, 453, 457, 464, 325/465, 468; 334/15; 307/223, 225; 328/41, 42

[56] References Cited

U.S. PATENT DOCUMENTS

| 3,518,586 | 6/1970 | Nilssen et al. | 325/465 |
| 3,652,960 | 3/1972 | Sakamoto et al. | 325/464 |
| 3,654,557 | 4/1972 | Sakamoto et al. | 325/465 |
| 3,879,747 | 4/1975 | Sakamoto | 325/465 |
| 4,047,112 | 9/1977 | Sakamoto | 325/465 |

Primary Examiner—Robert L. Griffin
Assistant Examiner—Jin F. Ng
Attorney, Agent, or Firm—Stevens, Davis, Miller & Mosher

[57] ABSTRACT

A channel selection apparatus comprises a counter, a decoder, a clock pulse generator, and a control circuit for controlling them, and selects a channel by switching a channel selection voltage by selecting a potentiometer. The counter includes a cascade-connected flip-flop such that a trailing edge of an AND output of an output of a flip-flop in one stage and a channel selection count input signal triggers a flip-flop in the following stage. The decoder includes a plurality of output transistors and a plurality of parallel-connected transistor sets with common collectors of each of the transistor sets being connected to a base of a corresponding output transistor and input signals being applied to bases of each of the transistor sets.

18 Claims, 31 Drawing Figures

FIG. 22
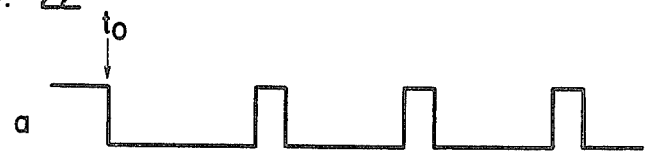
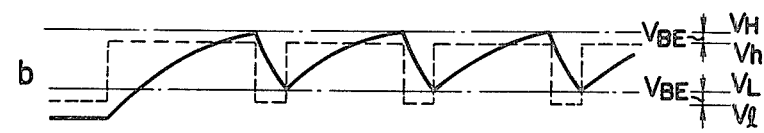
FIG. 23
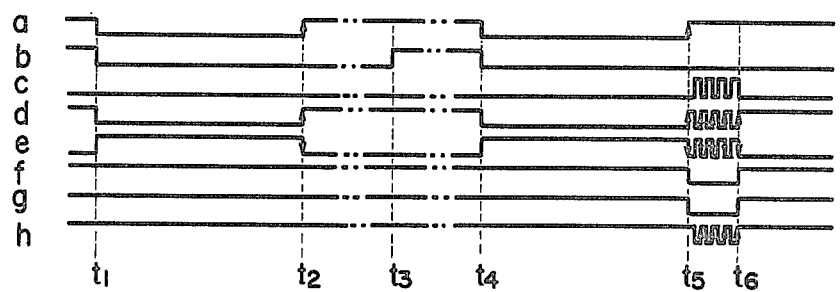
FIG. 24
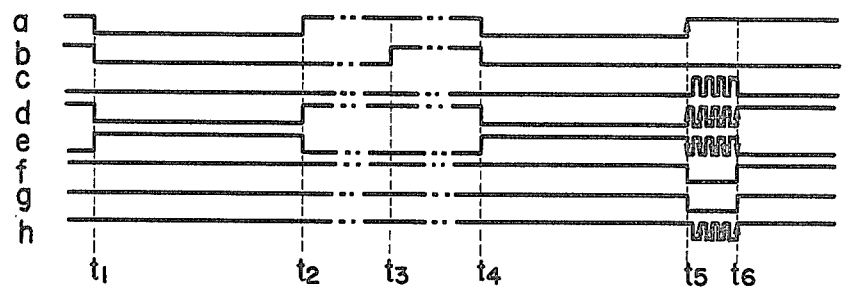
FIG. 25
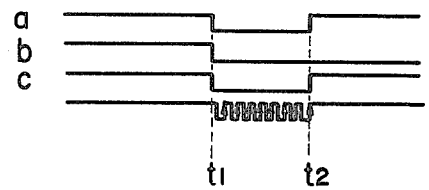

CHANNEL SELECTION APPARATUS

The present invention relates to a channel selection voltages to be selectively applied to in tuner including a tuning element comprising a variable capacitance diode are preset by a plurality of potentiometers which are selectively actuated to select a desired channel.

In the drawings:

FIGS. 22 to 25 show waveforms for illustrating the operation of the apparatus of FIG. 21;

Figure 1:
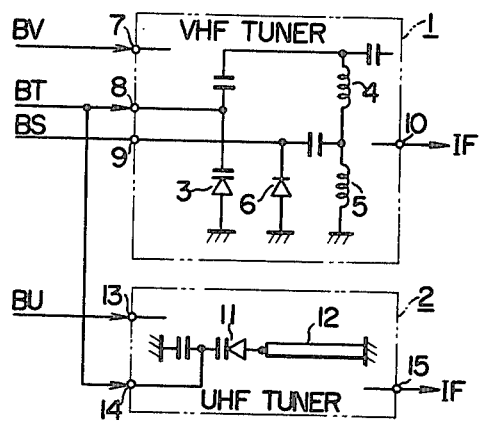
FIG. 1 shows a circuit diagram of a tuner which uses a voltage dependent variable capacitance diode.

In recent years, many channel selection apparatus use a variable capacitance diode as a tuning element of a tuner and selects a channel selection voltage to be applied to the variable capacitance diode to select a desired channel. FIG. 1 shows a main portion of such a tuner, in which numeral 1 denotes a VHF tuner, and numeral 2 denotes a UHF tuner. The VHF tuner 1 includes a variable capacitance diode 3 as the tuning element and coils 4 and 5 as well as a switching diode 6 for selecting either a VHF high band or a VHF low band. Numeral 7 denotes a terminal to which a power supply voltage BV for operating the VHF tuner 1 is applied, numeral 8 denotes a terminal to which a channel selection voltage BT for selecting the channel is applied, numeral 9 denotes a terminal to which a voltage BS for selecting the band is applied, and numeral 10 denotes an IF output terminal.

The UHF tuner 2 includes a variable capacitance diode 11 as the tuning element and a resonance line 12. Numeral 13 denotes a terminal to which a power supply voltage BU for operating the UHF tuner 2 is applied, numeral 14 denotes a terminal to which the channel selection voltage BT which is common to the VHF tuner 1 is applied and numeral 15 denotes an IF output terminal.

Only a portion of the tuning circuit is shown and all other circuit portions such as a local oscillation circuit and a mixing circuit are omitted.

Figure 2:
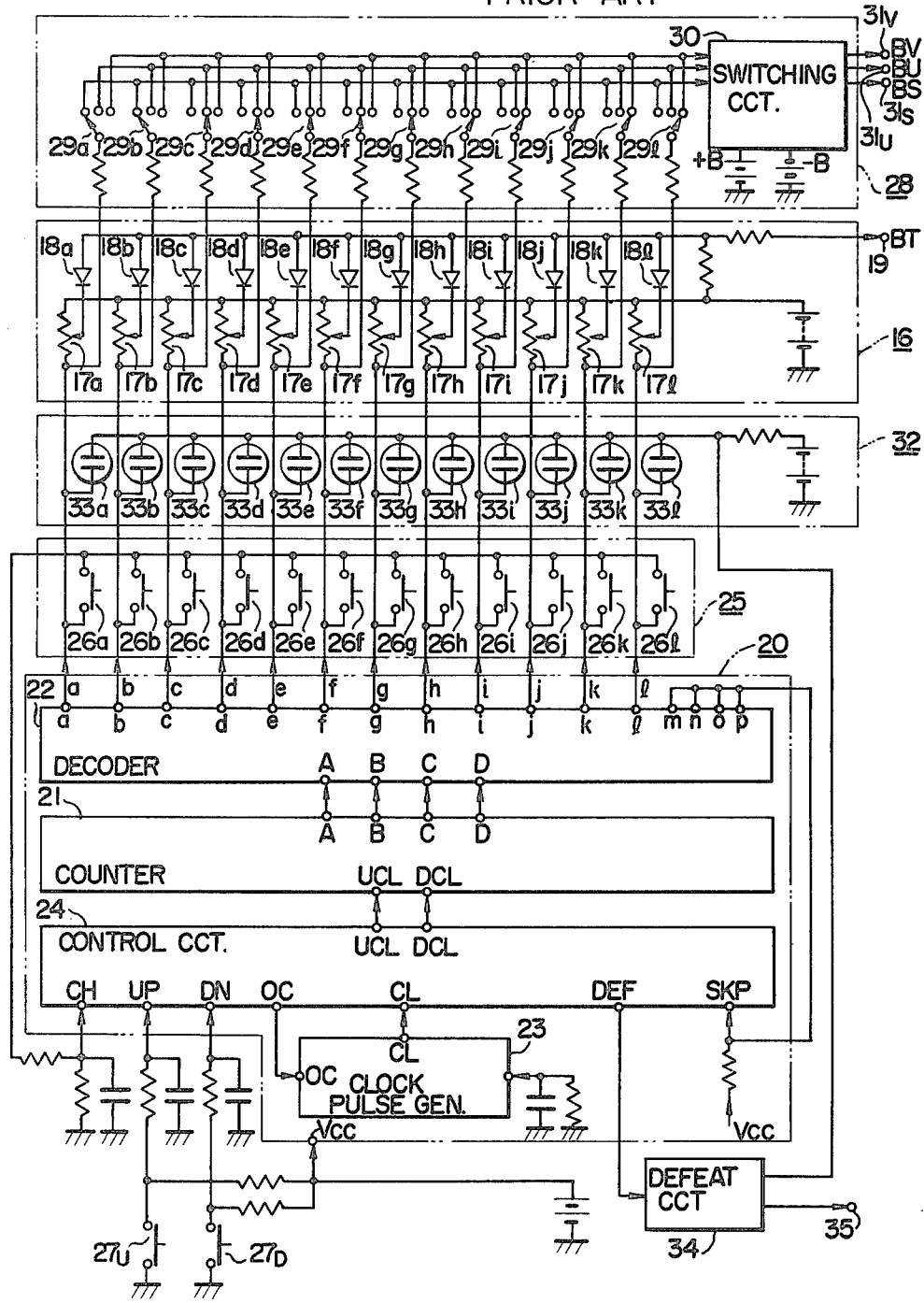
FIG. 2 shows a block diagram illustrating a basic configuration of a channel selection apparatus which can be used in the tuner of FIG. 1.

Referring to FIG. 2, an example of a basic configuration of an apparatus which applies a channel selection voltage to the tuner to select a desired channel and applies a band selection voltage to select a desired band is explained. The apparatus shown operates to select one of twelve channels. In FIG. 2, numeral 16 denotes a channel selection voltage presetting circuit for presetting the channel selection voltages BT to be selectively applied to the variable capacitance diode of the tuner and it includes twelve potentiometers 17a and 17l each of which has been preset to produce a channel selection voltage BT corresponding to each desired channel. A selected one of those channel selection voltages BT is taken from a terminal 19 through one of diodes 18a to 18l, which is then impedance-converted by a transistor or the like (not shown) and applied to the variable capacitance diodes 3 and 11 of the VHF tuner 1 and the UHF tuner 2, respectively.

Numeral 20 denotes a channel selection circuit for selectively actuating one of the potentiometers 17a and 17l, and it includes a binary counter 21 and a decoder 22 in the illustrated example. More particularly, the channel selection circuit comprises a pulse generating circuit 23, the binary counter 21 for counting the pulses of the pulse generating circuit 23, the binary-to-hexadecimal decoder 22 for producing a unique output in accordance with the binary output of the binary counter 21 and a control circuit 24 for controlling the operations of the counter 21 and the pulse generating circuit 23. The decoder 22 includes output switching transistors connected to sixteen output terminals a to p so that only one of those transistors is selectively rendered conductive in accordance with the binary output from the counter 21 to produce a down level output at one of the output terminals a to p. Of the potentiometers 17a to 17l which are connected to the twelve output terminals a to l out of the output terminals a to p, that potentiometer which is connected to the activated transistor is selected so that a current flows therethrough.

Connected between the output terminals a to l of the channel selection circuit 20 and an input terminal CH are normally open switches 26a and 26l which are mounted on a switch board 25, and one of the normally open switches 26a to 26l, e.g. the switch 26c is closed when the channel is selected. If the channel corresponding to the switch 26c has not been selecting the channel at that time, the output at the output terminal c of the decoder 22 to which the switch 26c is connected is at up level and this output is applied to the input terminal CH of the control circuit 24 through the switch 26c so that the pulse generating circuit 23 responds to an output from an output terminal OC to start to generate clock pulses CL, which are applied to the counter 21 through a terminal UCL. Thus, the counter 21 starts to count so that the conducting transistors in the decoder 22 change sequentially and the low-level output terminals change sequentially. When the transistor corresponding to the output terminal c to which the switch 26c is connected conducts to produce the low level output, the input to the input terminal CH of the control circuit 24 assumes the low level so that the pulse generating circuit 23 is deactivated. Thereafter, this channel selection condition is maintained until another channel switch is actuated. In this manner, a desired channel is selected. If the frequency of the clock pulses generated by the pulse generating circuit 23 is selected to be high enough such as higher than 1 KHz, the channel selection operation is completed in a very short time period during the closure of the switch.

Numerals 27U and 27D denote switches which are selectively actuated by actuating signals such as ultrasonic or light signals when sequential channel selection operation is to be carried out by a remotely controlled operation or a manual operation. When the switch 27U is actuated, a count-up signal is applied from the control circuit 24 to the counter 21 so that the channel is sequentially switched to the next higher channel. When the switch 27D is actuated, a count-down signal is applied from the control circuit 24 to the counter 21 so that the channel is sequentially switched to the next lower channel.

Numeral 28 denotes a band selection circuit which selects a band of the tuner when the channel is switched in the manner described above, and it comprises band setting switches 29a to 29l one for each of the channels and a switching circuit 30. The switch 29a to 29l each has a contact L for the VHF low band, a contact H for the VHF high band, a contact U for the UHF band and a common contact which is connected to the output terminal of the channel selection circuit 20 through a resistor. Numeral 31V denotes a terminal through which the power supply voltage BV for operating the VHF tuner 1 is supplied, numeral 31U denotes a terminal through which the power supply voltage BU for operating the UHF tuner 2 is supplied, and numeral 31S denotes a terminal through which the power supply voltage BS for selecting the coil to select the band in the VHF tuner 1 is supplied.

When a channel corresponding to a switch to which the VHF low band has been set, e.g. the switch 29a is to be selected, the condition as shown in row X of the table shown below is obtained so that the VHF low band is selected. When a channel corresponding to a switch to which the VHF high band has been set, e.g. the switch 29d is to be selected, the condition as shown in row Y is obtained so that the VHF high band is selected. Further, when a channel corresponding to a switch to which the UHF band has been set, e.g. the switch 29h is to be selected, the condition as shown in row Z is obtained so that the UHF band is selected. In this manner, the band selection is carried out.

|   | Switches | voltages | | | Selected bands |
|---|---|---|---|---|---|
|   |   | BV | BS | BU |   |
| X | L | +B | −B | O | VHF low band |
| Y | H | +B | +B | O | VHF high band |
| Z | U | O | −B | +B | UHF high band |

Numeral 32 denotes a channel indication circuit by which the selected channel is indicated by one of indication lamps 33a to 33l connected to the output terminals a to l, respectively, of the channel selection circuit 20.

Numeral 34 denotes a defeat circuit which produces a defeat signal at an output terminal DEF of the control circuit 24 during the channel selection operation to inhibit the indication by the channel indication circuit 32 and which also produces an output at an output terminal 35 to inhibit the operation of an AFC circuit for the tuner.

The basic configuration of the channel selection apparatus which uses the counter and the decoder has been described above. In the prior art channel selection apparatus, however, the operations of the counter and the decoder tended to be unstable and hence the entire apparatus tended to be unstable. When a stable operation was desired, very high level of semiconductor technologies must be used and many additional components were required. Thus, the prior art apparatus had disadvantages of the difficulty in manufacturing and high cost.

It is, therefore, an object of the present invention to overcome the above difficulties and provide a channel selection apparatus which is simple in construction and stable in operation.

It is another object of the present invention to provide a channel selection apparatus which is easy to manufacture.

It is another object of the present invention to provide a channel selection apparatus of an IC structure which can select a predetermined channel when a power is turned on without increasing the number of pins required for the IC structure.

According to the present invention, a channel selection apparatus is provided which comprises;

a tuner having a voltage dependent variable reactance element as a tuning element;

a plurality of potentiometers for presetting channel selection voltages one for each of a plurality of channels, said channel selection voltages being selectively applied to said variable reactance element of said tuner for selecting a desired channel;

a coupling means for coupling selected one of said potentiometers to said tuner such that one of said channel selection voltages taken from said selected potentiometer is applied to said variable reactance element of said tuner;

a counter including a plurality of flip-flops and connecting means for cascade-connecting said plurality of flip-flops such that a trailing edge of an AND output of an output of the flip-flop in one stage and a channel selection count input signal triggers the flip-flop of the next stage;

a clock pulse generating circuit for generating clock pulses;

a control circuit responsive to a channel selection control input applied to an input terminal thereof to extract said clock pulses and couple said counter to said clock pulse generating circuit such that said extracted clock pulses are applied to said counter as said count input signal;

a decoder including binary signal input terminals, a plurality of output terminals said decoder being responsive to said binary signal to produce an output at one of said output terminals, a plurality of output terminals connected to said plurality of output terminals, respectively, a plurality of parallel-connected transistor sets, means for coupling the bases of said output transistors to the common collectors of the respective ones of said transistor sets, and means for coupling said binary signal input terminals to the bases of the respective ones of said transistor sets;

a coupling means for coupling said output terminals of said decoder to said potentiometers to select one of said plurality of potentiometers in accordance with the output of said decoder; and a switch means connected to said input terminal of said control circuit to apply said channel selection control input to said input terminal.

The present invention will now be described in detail with reference to the drawings, about to major units thereof, that is, the counter, the decoder, the control circuit and the pulse generating circuit, in comparison with the prior art circuits.

The counter is first explained. An up/down counter heretofore used has a disadvantage in that an erroneous operation may take place in view of a narrow pulse produced due to time delay in gates, and even if the time delay is eliminated by spacial semiconductor manufacturing technologies, a range of operating voltage is very narrow.

Figure 3:
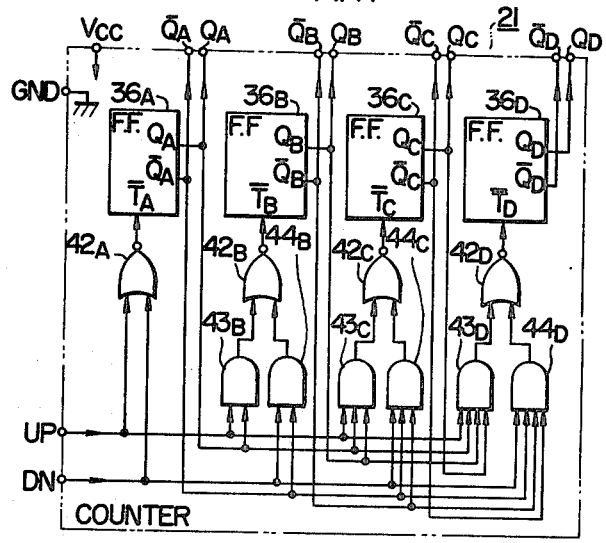
FIG. 3 shows a block diagram of a counter used in a prior art channel selection apparatus.
Figure 4:
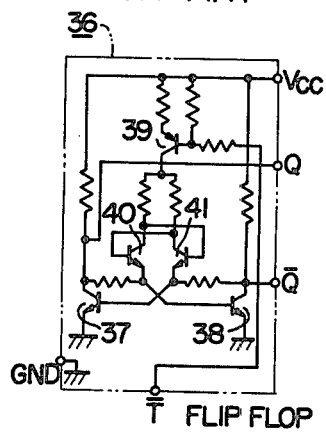
FIG. 4 shows a circuit diagram of a flip-flop used in the counter of FIG. 3.

FIG. 3 shows a prior art up/down counter and FIG. 4 shows flip-flops 36A to 36D used in that counter. The operation of the flip-flops of FIG. 4 is first explained. Since the four flip-flops are identical, only one of them is shown. Assume that a Q output is "0", and the transistor 37 is conductive, and a $\overline{T}$ input is "1". When the $\overline{T}$ input changes to "0", a transistor 39 conducts, and a transistor 40 conducts to render a transistor 38 conductive. Thus, the Q output assumes "0" while a $\overline{Q}$ output assumes "1" establishing a stable state. Similarly, when "0" signal is next applied to the $\overline{T}$ input, the transistor 41 conducts to redner the transistor 37 conductive so that the $\overline{Q}$ output and the Q output are again reversed.

In FIG. 3, numerals 42A to 42D denote NOR gates, and numerals 43B to 43D and 44B to 44D denote AND gates.

Figure 5:
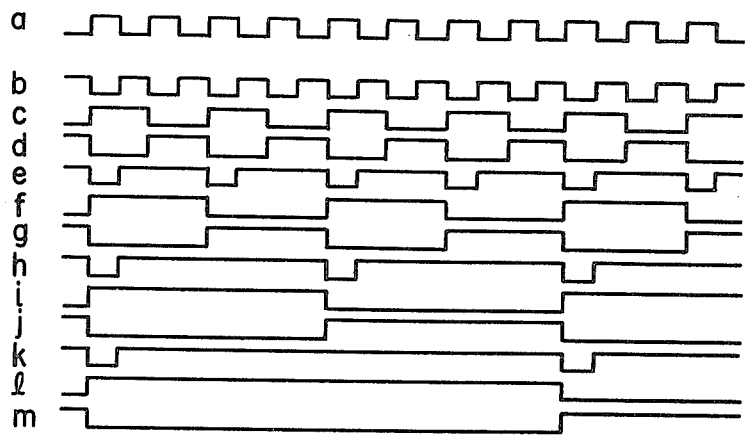
FIGS. 5 and 6 show waveforms for illustrating the operation of the counter of FIG. 3.
Figure 6:
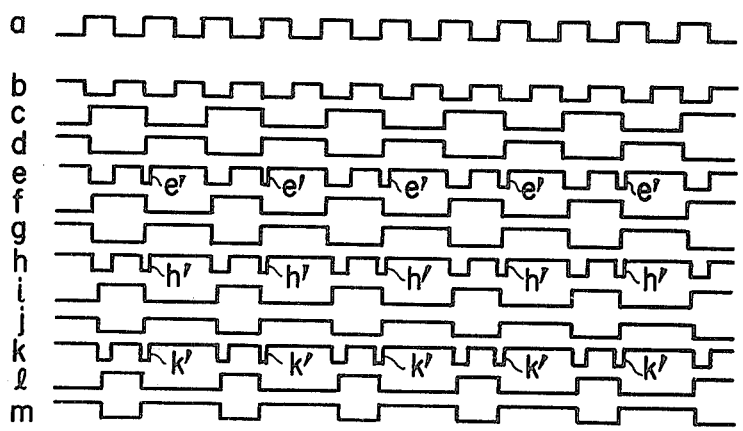

The operation of the logical circuit is explained in conjunction with timing charts of FIGS. 5 and 6.

FIG. 5 shows a timing chart for an ideal operation where no time delay is included. In actual, however, a time delay is included and it is difficult from technical viewpoint to reduce the time delay.

Assuming that an input to a count-down terminal DN is "0" and a clock signal as shown in FIG. 5a is applied to a count-up terminal UP, an output of the NOR gate 42A assumes "1" when the input to UP is "0", producing a waveform as shown in FIG. 5b. Since the output b is applied to a $\overline{T}_A$ input of each of the flip-flops 38A to 36D, each flip-flop is triggered at the fall of the $\overline{T}_A$ input b and reversed thereby.

Since the DN input is "0", the output of the AND gate 44B is "0", and since an output of the AND gate 43B is a logical AND function of a $Q_A$ output c and the UP input a, it assumes "1" only when the $Q_A$ output c is "1" and the UP input a is "1". An output e of the NOR gate 42B produces an inverted output of the output of the AND gate 43B. This is a $\overline{T}_B$ input e. $Q_B$ and $\overline{Q}_B$ outputs f and g of the flip-flop 36B are reversed by the fall of the $\overline{T}_B$ input e.

Similarly, the flip-flop 36C is triggered by the AND gate 43C and the NOR gate 42C at the fall of a $\overline{T}_C$ input of an inverted output h of a logical AND function of the $Q_A$ output c of the flip-flop 36A, a $Q_B$ output f of the flip-flop 36B and the UP input a, to produce $Q_C$ and $\overline{Q}_C$ outputs i and j. The flip-flop 36D is triggered by the AND gate 44D and the NOR gate 42D at the fall of a $\overline{T}_D$ input of an inverted output k of a logical AND function of the $Q_A$ output c, the $Q_B$ output f, the $Q_C$ output i and the UP input a, to produce $Q_D$ and $\overline{Q}_D$ outputs l and m. The $\overline{Q}_A$, $\overline{Q}_B$, $\overline{Q}_C$ and $\overline{Q}_D$ outputs d, g, j and m are inverted ones of the $Q_A$, $Q_B$, $Q_C$ and $Q_D$ outputs c, f, i and l.

The above shows the timing for an ideal operation where no time delay is included. In actual however, the operations of the flip-flops and the gates include time delays. FIG. 6 shows a time chart which was depicted taking those time delays into consideration. Like waveforms to those of FIG. 5 are designated by like reference characters.

When the UP input a passes through the NOR gate 42A, a time delay of the gate occurs so that the $\overline{T}_A$ input b has slightly delayed rise and fall relative to the UP input a. The outputs c and d of the flip-flop 36A which is triggered by the $\overline{T}_A$ input b are also reversed slightly later than the fall of the $\overline{T}_A$ input b. Since the output of the NOR gate 42B is the inverted one of the logical AND function of the $Q_A$ output c and the UP input a, it produces a narrower pulse e' because there is a time delay between the fall of the UP input a and the fall of the $Q_A$ output c, in addition to the normal $\overline{T}_B$ input e. Thus the $\overline{T}_B$ input e assumes a waveform as shown in FIG. 6e. Since the flip-flop 36B is triggered at the fall of the $\overline{T}_B$ input e, the $Q_B$ and $\overline{Q}_B$ outputs thereof assume waveforms as shown in FIGS. 6f and 6g. The same is true for the $\overline{T}_C$ input k and their outputs assume the waveforms as shown in FIG. 6, which are not normal frequency-divided waveforms. Because of pulse waveforms, normal 4-bit up/down counter operation is not attained.

In order to avoid the above problem, it has been heretofore practiced to increase the switching speed of the transistors. However, such approach requires additional current or special diffusion process in making IC's.

It has been also proposed to add capacitances to eliminate the pulses. A considerable effect is observed when capacitors of several pF are connected between the bases and the collectors of the output transistors of the NOR gates 42B to 42D. This approach, however, has a drawback of low yield when IC structure is used because it depends on a power supply voltage and the DC current amplification factor ($h_{FE}$) of the transistor.

As described above, the prior art counters have drawback of requiring a high precision power supply to stabilize the power supply voltage in order to attain stable operation and hence increasing the cost. The present invention uses a counter which is free from such drawback.

Figure 7:
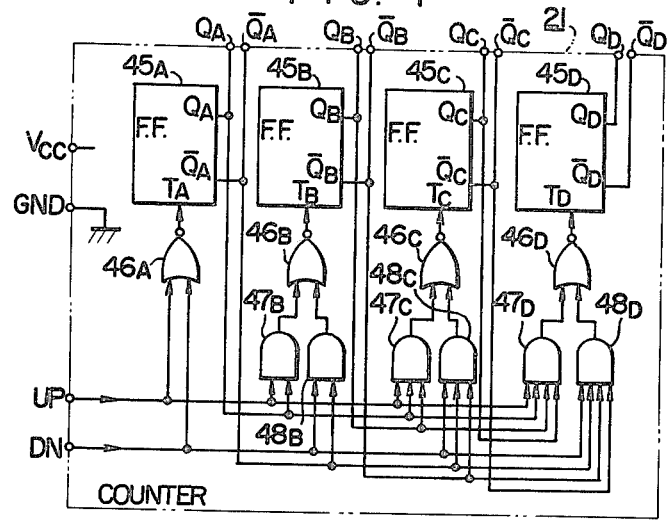
FIGS. 7 and 9 show block diagrams of counters used in a channel selection apparatus in accordance with one embodiment of the present invention.
Figure 8:
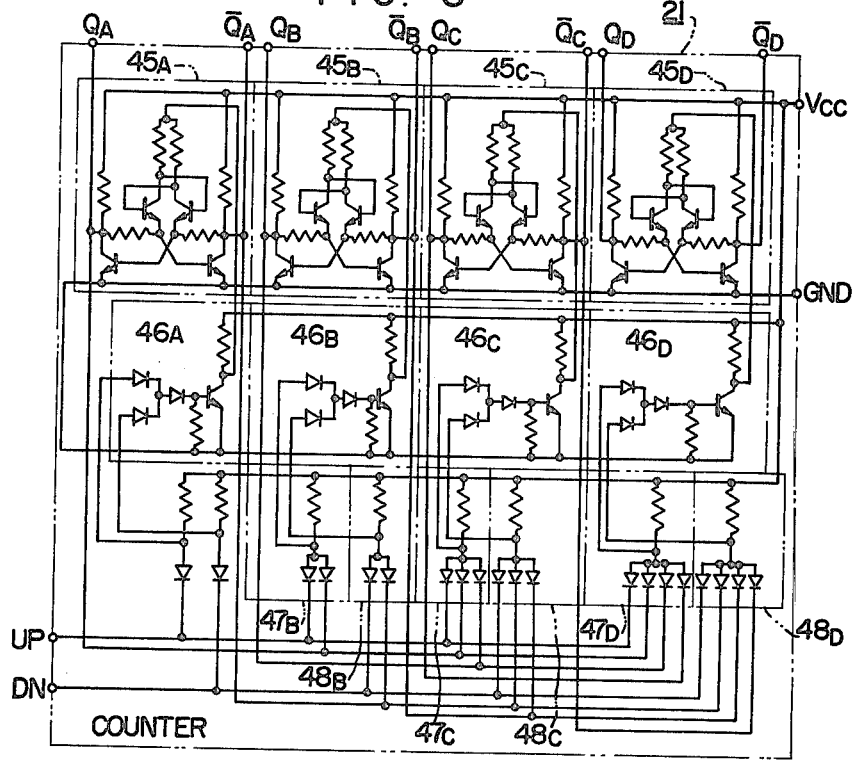
FIGS. 8 and 10 show circuit diagrams of the counters of FIGS. 7 and 9.
Figure 9:
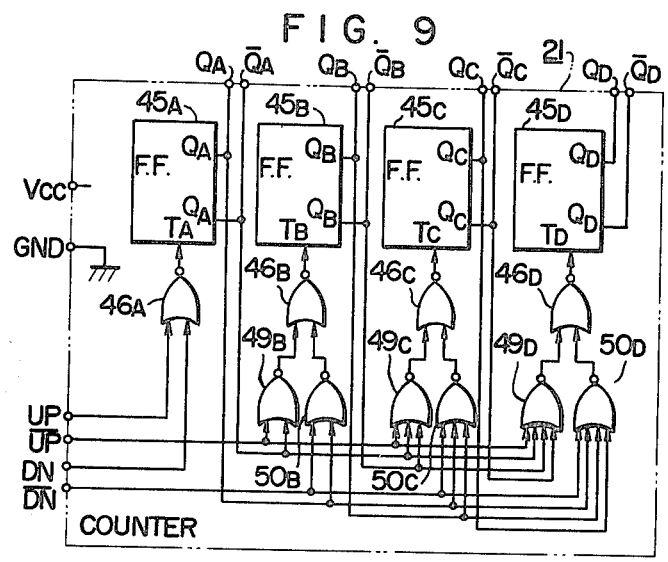
Figure 10:
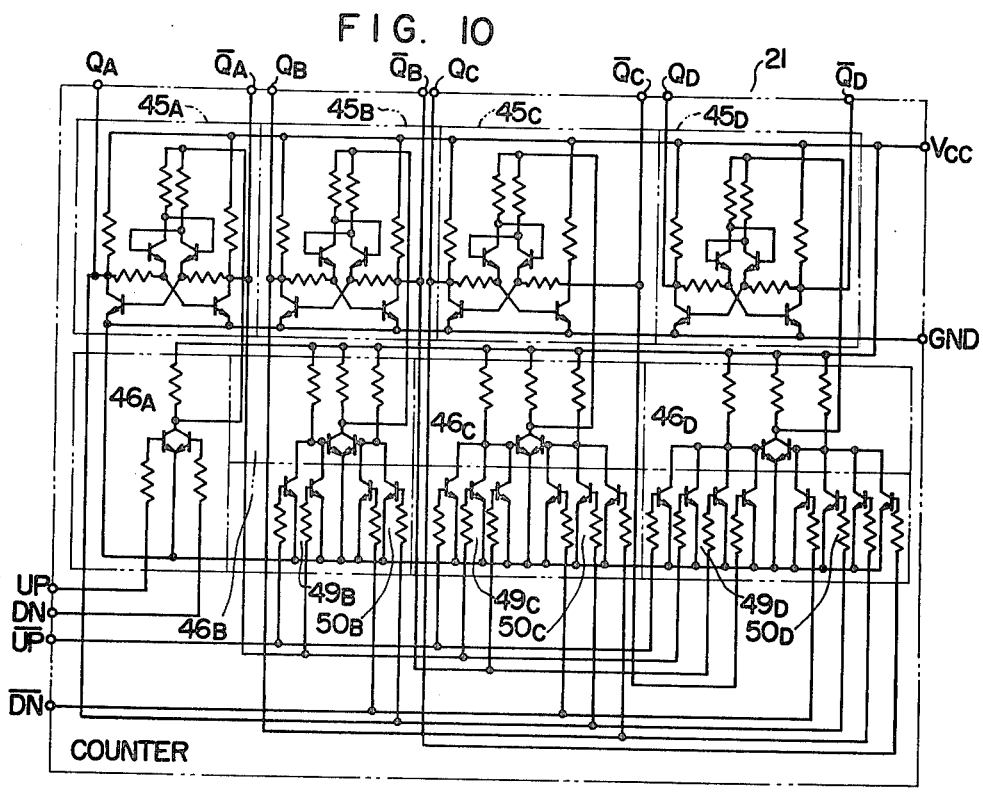
Figure 11:
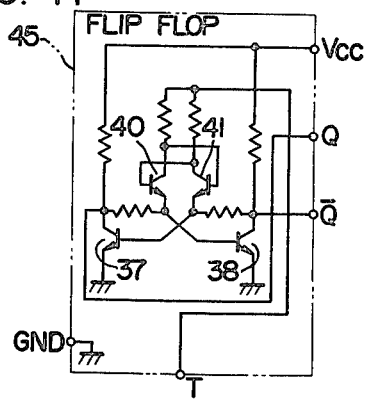
FIG. 11 shows a circuit diagram of a flip-flop used in the counters of FIGS. 7 and 9.
Figure 12:
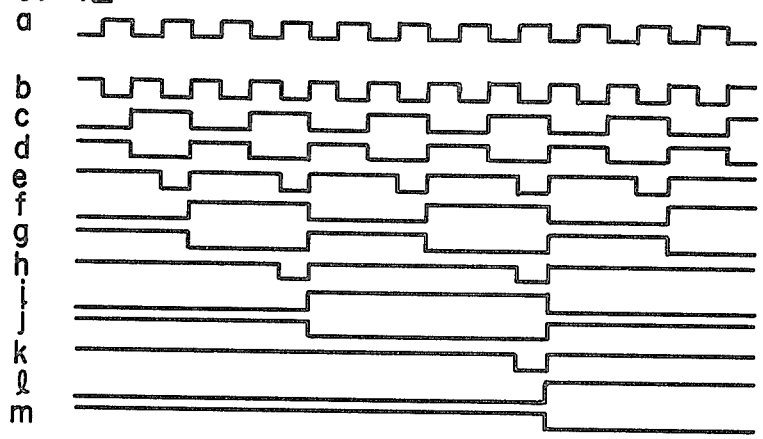
FIGS. 12 and 13 show waveforms for illustrating the operations of the counters.
Figure 13:
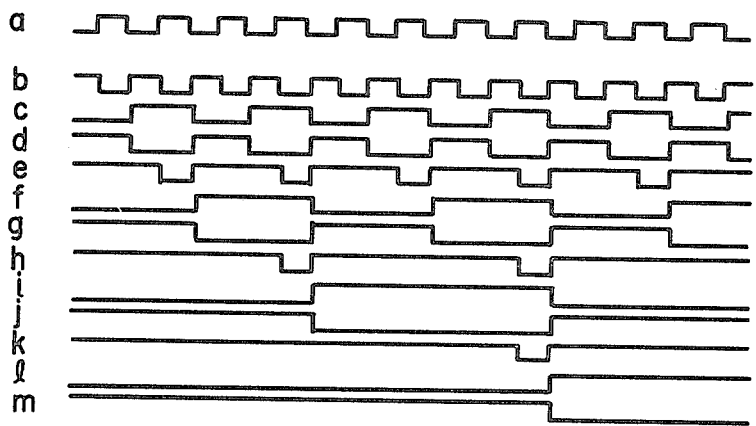

Referring to FIGS. 7 to 13, a counter in accordance with one embodiment of the present invention which has overcome the above difficulties is explained. FIGS. 7 and 8 show a block diagram and a circuit diagram of a counter composed of AND gates, FIGS. 9 and 10 show a block diagram and a circuit diagram of a counter composed of NOR gates, FIG. 11 shows a circuit diagram of a flip-flop used, and FIGS. 12 and 13 show time charts thereof.

In FIG. 11, the operation of a flip-flop 45 is substantially the same as that of the flip-flop 36 except that a PNP transistor 39 in the flip-flop 36 is omitted in the flip-flop 45 so that it is triggered at the rise of the trigger input T.

In FIG. 7, the numerals 45A to 45D denote flip-flops, 46A to 46D denote NOR gates, 47B to 47D and 48B to 48D denote AND gates, each corresponding to that shown in FIG. 3.

Referring to the timing charts of FIGS. 12 and 13, the operation of the counter shown in FIGS. 7 and 8 is explained. FIG. 12 shows the timing chart without time delay, and FIG. 13 shows the timing chart with time delay being taken into consideration.

Assuming that the DN input is "0" and the UP input a as shown in FIG. 12a is applied, the outputs of the AND gates 48B to 48D are "0" because the DN input is "0". The trigger input $T_A$ to the flip-flop 45A is an inverted one of the UP input a by the NOR gate 46A, and the flip-flop 45A is triggered by the rise of the $T_A$ input b to reverse the $Q_A$ and $\overline{Q}_A$ outputs c and d.

The flip-flop 45B in the next stage receives through the AND gate 47B and the NOR gate 46B a trigger input $\overline{T}_B$ which is an inverted one e of the logical AND output of the UP output a and the $Q_A$ output c of the flip-flop 45A, and is triggered by the rise of the trigger input e to produce $Q_B$ and $\overline{Q}_B$ outputs f and g. The flip-flop 45C in the following stage receives through the AND gate 47C and the NOR gate 46C a trigger input $T_C$ which is an inverted one h of the logical AND output of the UP input a, the $Q_A$ output c and the $Q_B$ output f, and is triggered by the rise of the $T_C$ input h to produce $Q_C$ and $\overline{Q}_C$ outputs i and j. Similarly, the flip-flop 45D in the following stage receives through the AND gate 47D and the NOR gate 46D a trigger input $T_C$ which is an inverted one k of the logical AND output of the UP input a, the Q output c, the $Q_B$ output f and the $\overline{Q}$ output i, and is triggered by the rise of the $T_C$ trigger input k to produce $Q_D$ and $\overline{Q}_D$ outputs l and m.

Referring to FIG. 13 which shows the timing chart depicted taking the time delay into consideration, the operation of the counter of FIG. 7 is explained while taking the time delay into consideration. Assume that the DN input is "0" as before. The trigger input or $T_A$ input b to the flip-flop 45A has slightly delayed rise and fall relative to the UP input a. The $Q_A$ and $\overline{Q}_A$ outputs c and d of the flip-flop 45A triggered by the $T_A$ input b are also slightly delayed relative to the $T_A$ input b and produce the wavefors as shown in FIGS. 13c and 13d. Since the $Q_A$ output c is produced when the flip-flop is triggered at the rise or trailing edge of the $T_A$ input b, it is apparent from the timing chart that even if the rise and the fall of the $Q_A$ ouput c delay relative to the $T_A$ input c, the triggering $T_B$ input e to the flip-flop 45B of the next stage includes no extra pulse if the delay is less than one half of the cycle period of the UP input a. Similarly, no extra pulse is included in the $T_C$ input h and the $T_D$ input k, like in the case of the $T_B$ input e. In this manner, exact and stable counter operation is attained.

While the counter-up operation has been explained above, it should be understood that similar stable operation is also attained in the count-down operation.

FIGS. 9, and 10 show a similar counter to that shown in FIG. 7, which is constructed by NOR gates 49B to 49D and 50B to 50D. The operation thereof is similar to that described above and hence it is not explained here.

With the arrangement of FIG. 10, conventional transistors ($I_C \approx 1$ mA, $V_{CE(sat)} \approx 0.1$ V) can be used at the count up/down $\overline{UP}$ and $\overline{DN}$ input terminals and UP and DN input terminals, even if the circuit is constructed in IC structure. Thus, the arrangement of FIG. 10 is advantageous to construct the circuit including the count up/down control circuit in IC structure, with the advantages of low power consumption, wide range of operating voltage and small chip size when constructed in IC structure.

As described above, in the counter constructed by cascade-connecting a plurality of flip-flops, since the flip-flop in one stage is triggered by the trailing edge of the AND output of the output of the flip-flop in the preceeding stage and the count input, no sprious pulse which leads to erroneous triggering is produced even if the flip-flops and the gates include time delay so that exact counting operation is attained.

The decoder which receives the finary signal from the counter and converts the binary signal to activate the presetting potentiometer is now explained.

Figure 14:
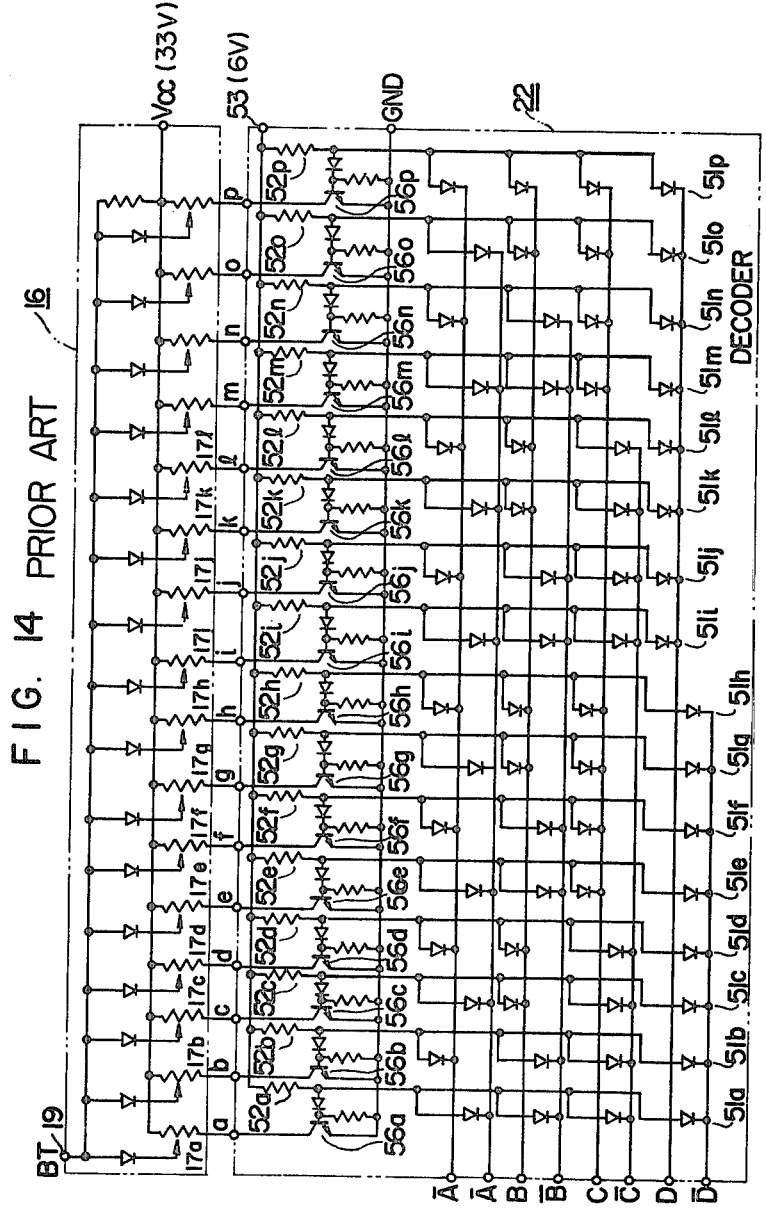
FIG. 14 shows a circuit diagram of a decoder used in a prior art channel selection apparatus.

A decoder which has been heretofore used for this purpose is shown in FIG. 14. The decoder 22 comprises AND gate 51a to 51p composed of a diode matrix and output transistors 56a to 56p.

One of the potentiometers 17a to 17l of the channel selection voltage setting circuit 16 is selected by the output terminals a and l to produce an output at a terminal 19.

Cathodes of eight diodes are connected to each of input terminals A to $\overline{D}$. When the input terminal goes to down level L, the total sum of the currents flowing in the diodes connected to that input terminal flows into the output transistors 54a to 54d and 55a to 55d of the counter 21 through the input terminals A to $\overline{D}$.

In this case, load resistors 52a to 52p are usually in the order of 5 kΩ, and a voltage in the order of 6 volts is supplied to a power supply terminal 53. Consequently, currents in the order of 1 mA flow through the load resistors 52a to 52p in the worst case and those current may flow into the diodes. Thus, the current which flows into the "L" level input terminal reaches approximately 8 mA.

Figure 15:
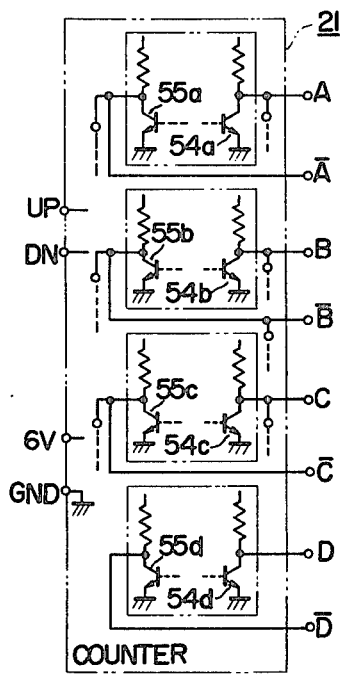
FIG. 15 shows a circuit diagram of a portion of a counter for applying an input to the decoder of FIG. 14.

The decoder 22 is connected to the binary output terminals A to $\overline{D}$ of the counter 21 shown in FIG. 15. Thus, the current up to about 8 mA may flow into the output terminals 54a to 54d and 55a to 55d of the counter 21.

When those circuits are implemented in the IC structure, if a current in the order of 1 mA flows into the collector of the respective transistors 54a to 54d and 55a to 55d, the collector saturation voltage during the conduction of the transistor is in the order of 0.1 to 0.2 volts which is sufficient to maintain the transistor at low level, but if the current in the order of 8 mA flows into the transistor, the collector saturation voltage reaches up to 0.5 to 0.6 volts which makes the low level at the output terminals A to D of the counter 21 unstable so that the output of the decoder 22 is not assured. For example, if the binary signal "A, $\overline{A}$, B, $\overline{B}$, C, $\overline{C}$, D, $\overline{D}$" is "LHLHLHLH", only the transistor 56a in the decoder 22 is to be conductive and the other transistors 56b to 56p are to be non-conductive. However, if the input L level is in the order of 0.6 volts, the transistors 56b to 56p may conduct due to manufacturing tolerance of the IC. Therefore, the operation may be very unstable.

In order to attain the stable operation, heretofore, the L level to the binary signal input circuit of the decoder 22 was lowered, that is, the collector saturation voltage of the output transistors 54a to 54d and 55a to 55d of the counter 21 was lowered. In order to lower the collector saturation voltage, however, the chip size of the transistor must be increased to about three to four times as large as the chip size of the transistor in which a collector current in the order of 1 mA flows and a collector saturation voltage is in the order of 0.1 volt. Therefore, this approach is disadvantageous from both size viewpoint and cost viewpoint.

As an alternative, it is possible to assure the switching operation by inserting a pair of level shift diodes in series with the base of each of the output transistors 56a to 56p of the decoder 22. Even in such arrangement, the output transistors 54a to 54d and 55a to 55d of the counter 21 must be designed to withstand the current in the order of 8 mA, and the number of components increases, leading to the increase of cost.

Figure 16:
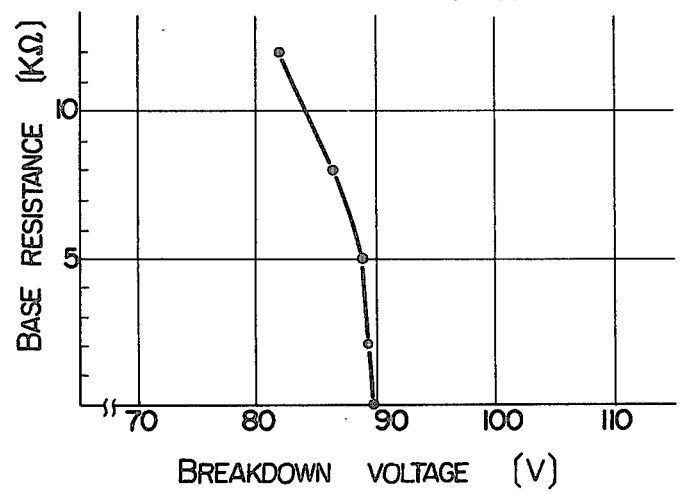
FIG. 16 shows a characteristic chart for illustrating a characteristic of the decoder of FIG. 14.

In the prior art circuit, resistors are inserted between the bases and the emitters of the output transistors 56a to 56p so that the transistors are cut off when any of the inputs is at "L" level. FIG. 16 shows a breakdown voltage characteristic of the transistor at $I_C=40$ $\mu A$ when the base resistance is changed. It is thus seen that the output breakdown characteristic changes with the resistance of the base resistor, and the variance of the base resistance which occurs when the circuit is constructed in the IC structure results in the variance in the output breakdown voltage. In general, the variance of resistance in the IC structure is in the order of $\pm 10\%$ and it may reach $\pm 50\%$ depending on a particular manufacturing process. Consequently, when the prior art circuit is implemented in the IC structure, the yield is low, which leads to the increase of cost.

In the present apparatus, a counter is used which overcomes all of the difficulties encountered in the prior art circuits, can stabilize the operation, requires less number of components, can reduce the size and can improve the breakdown voltage.

Figure 17:
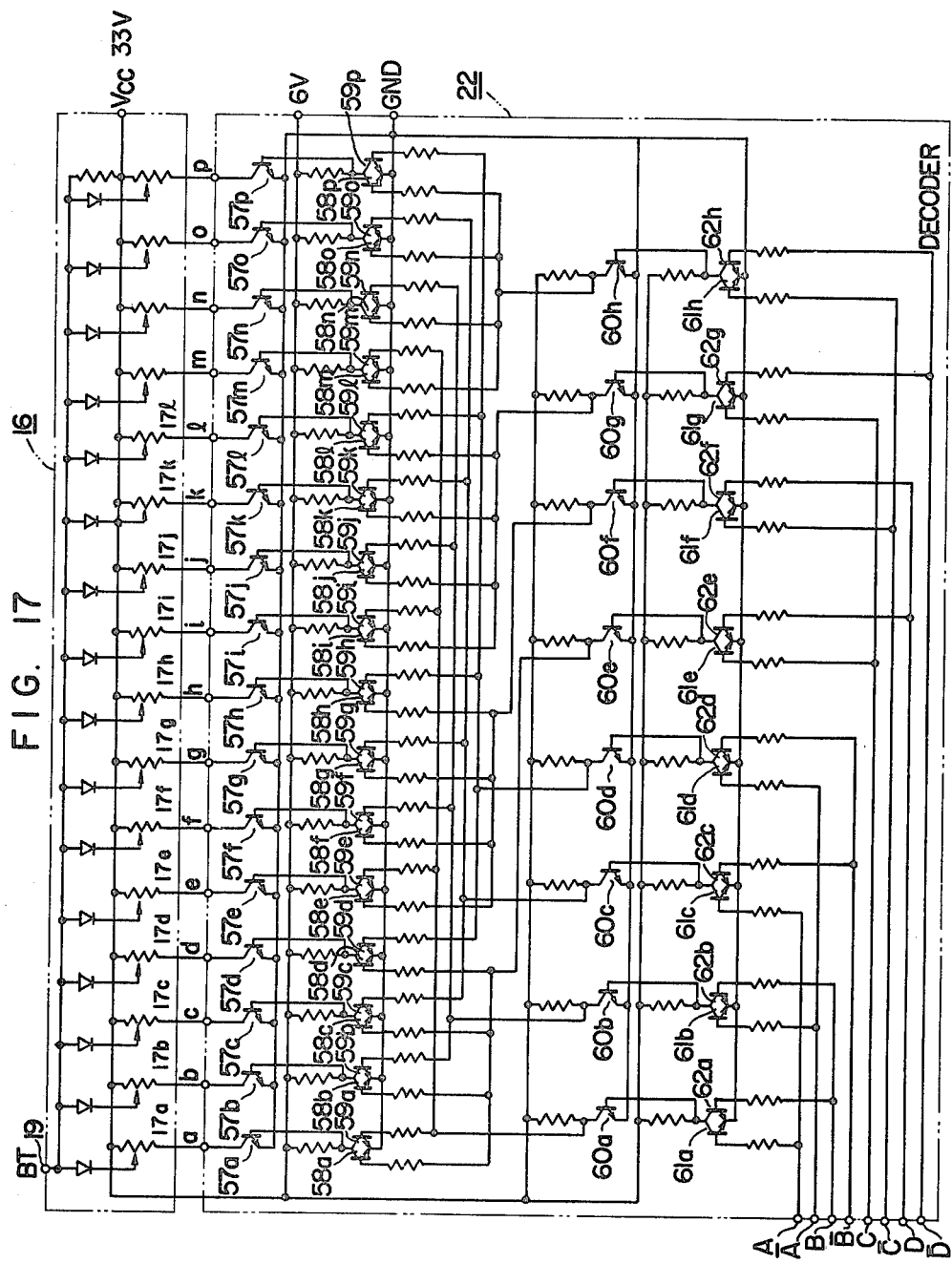
FIGS. 17 and 19 show circuit diagrams of decoders used in the channel selection apparatus in accordance with one embodiment of the present invention.

Referring to FIGS. 17 to 20, embodiments thereof are explained. FIG. 17 shows a first embodiment in which the decoder 22 has the output terminals a to p connected to collectors of the output transistors 57a to 57p, bases of which are connected to common collectors of parallel-connected transistors 58a to 58p and 59a to 59p with inputs being applied to respective bases of the transistor 58a to 58p and 59a to 59p. In the circuit of FIG. 17, in order to carry out binary to count-of-n decoding operation, the above arrangement is cascade-connected such that the bases of the transistors 58a to 58p and 59a to 59p are connected to the collectors of the transistors 60a to 60h, the bases of which are connected to the common collectors of the parallel-connected transistors 61a to 61h and 62a to 62h and input terminals A to $\overline{D}$ are connected to the bases of the transistors 61a to 61h and 62a to 62h.

Figure 18:
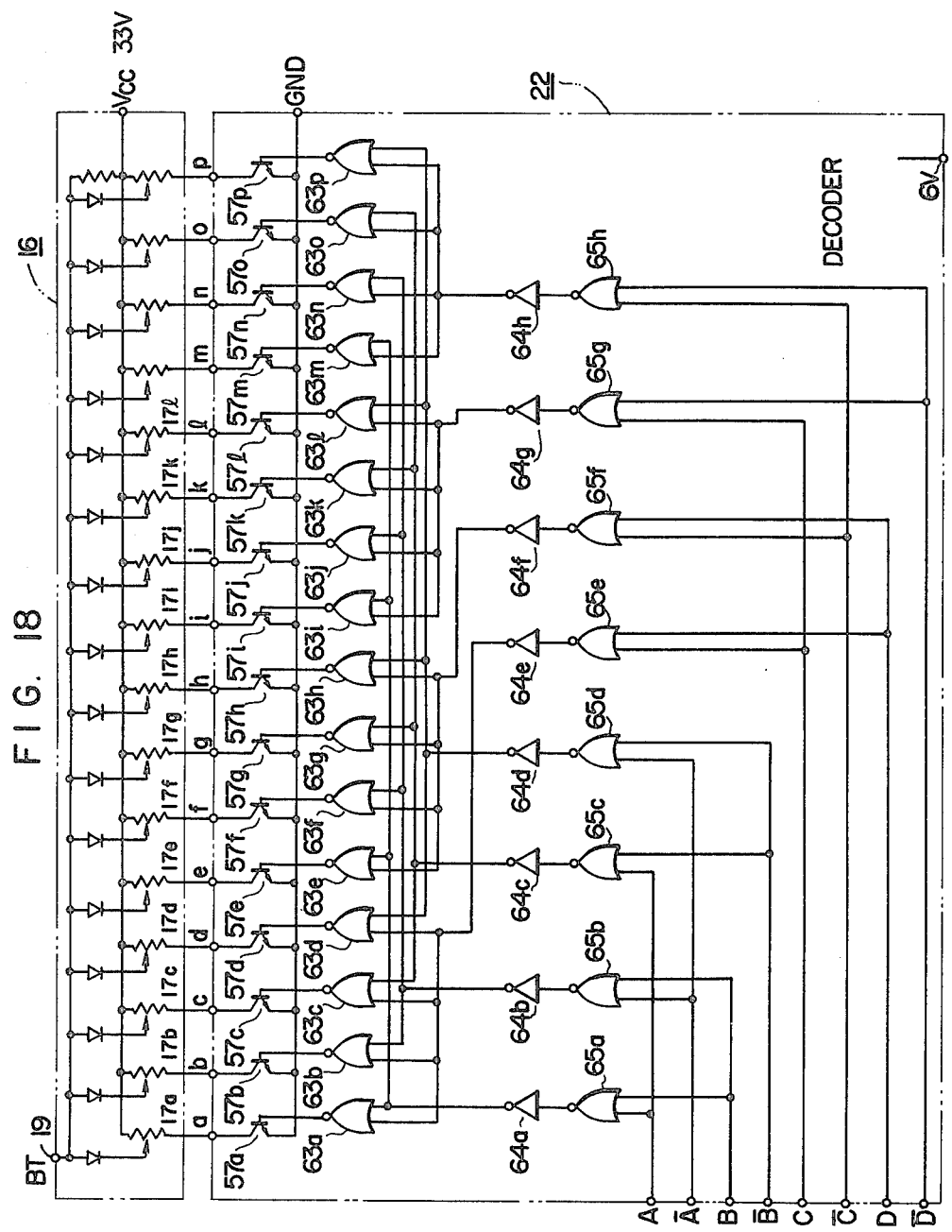
FIGS. 18 and 20 show block diagrams of the decoders of FIGS. 17 and 19.

FIG. 18 shows an equivalent block diagram of FIG. 17, in which NOR gates 63a to 63p correspond to the transistors 58a to 58p and 59a to 59p, inverters 64a to 64h correspond to the transistor 60a to 60h, and NOR gates 65a to 65h correspond to the transistors 61a to 61h and 62a to 62h.

In this arrangement, when the output of the counter 21 is applied to the input terminals A to $\overline{D}$ of the decoder 22, large current does not flow into the output transistors, unlike in the prior art circuit, even if the outputs A to $\overline{D}$ of the counter 21 are at L level. Consequently, the output transistors of the counter 21 may be conventional transistors. In other words, the transistors having $I_C$ equal to 1 mA and collector saturation voltage equal to 0.1 to 0.2 volts may be used. Since the L level is stabilized, the operation is stable.

In the circuit of FIG. 17, the bases of the transistors 57a to 57p are grounded through the transistors 58a to 58p and 59a to 59p. Consequently, assuming that the collector saturation voltage of the transistors 58a to 58p and 39a to 59p when the collector current is equal to 1 mA is 0.1 volt, the equivalent resistance is 100 $\Omega$. Thus, the breakdown voltage of the transistors 57a to 57p corresponds to the breakdown voltage when the resistance in FIG. 16 is equal to 100 $\Omega$. Therefore, the breakdown voltage is high and stable.

In the prior art circuit configuration, it has been difficult to reduce the base resistance to a low resistance in the order of 100 $\Omega$ because power dissipation and current increase. The circuit configuration of the present decoder readily attain the above object.

Figure 19:
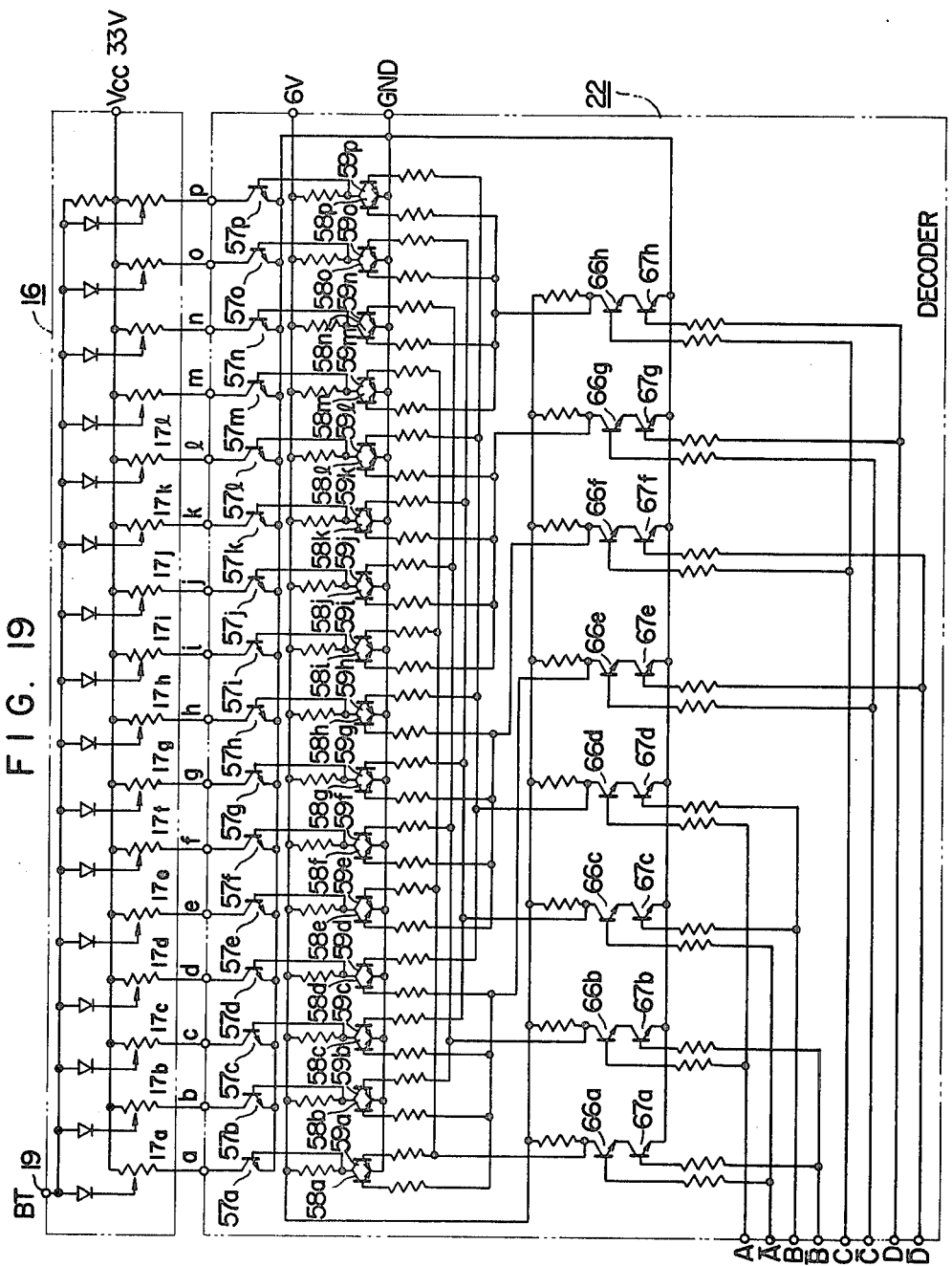
Figure 20:
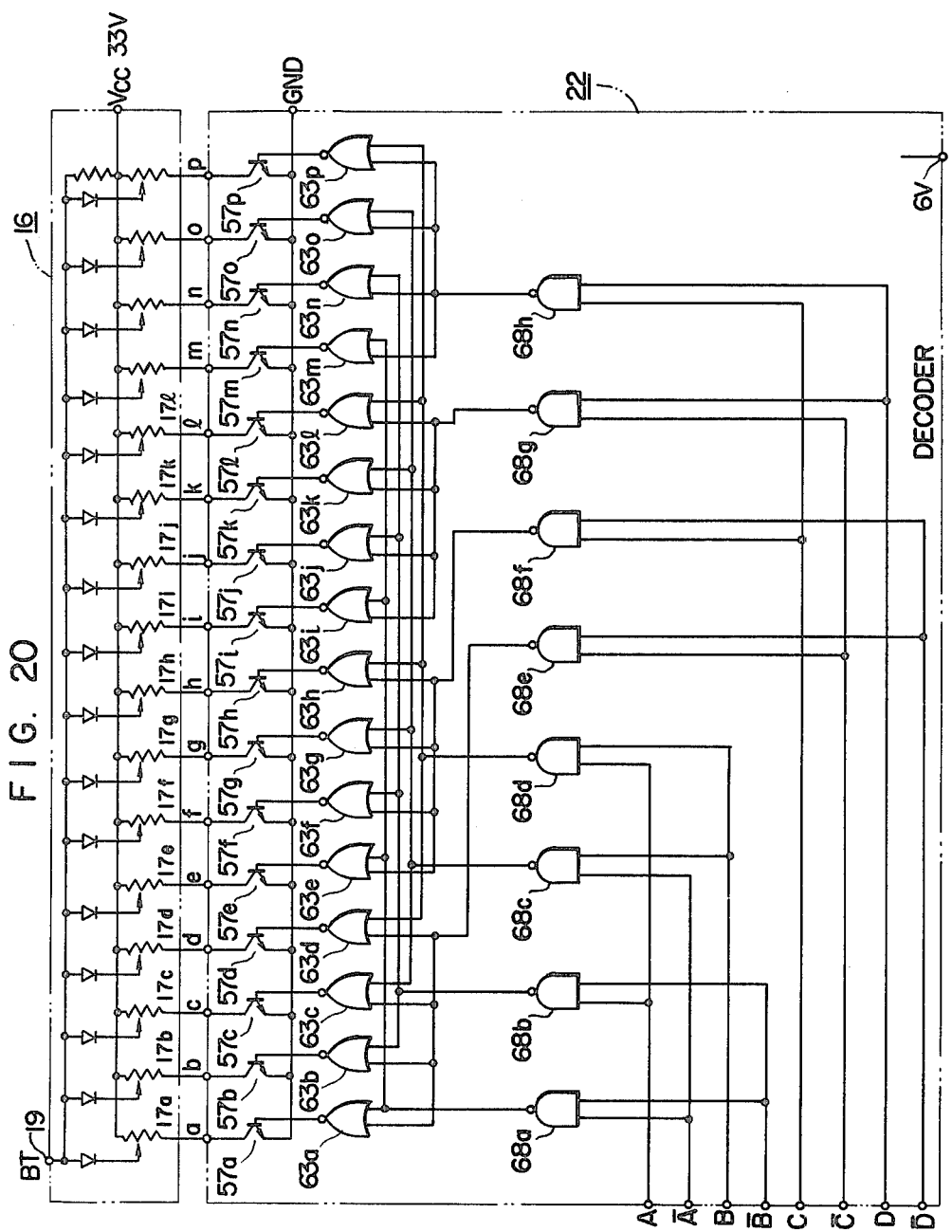

FIG. 19 shows a circuit diagram of another embodiment of the decoder constructed in the same concept, and FIG. 20 shows an equivalent block diagram thereof, which is also basically identical to those of FIGS. 17 and 18. NAND gates 68a to 68h are constructed by transistors 66a to 66h and 67a to 67h which are connected in series with the input circuit to reduce the number of components. In the prior art circuit shown in FIG. 14, the decoder 22 comprises 16 transistors, 80 diodes (96 semiconductor devices) and 32 resistors, while the circuit of FIG. 19 comprises 64 transistors and 72 resistors.

The total number of components is 128 for the prior art circuit and 136 for the circuit of FIG. 19. The circuit of FIG. 19 requires eight more components in total but the number of semiconductor devices is 22 less than the prior art circuit. Consequently, the chip size when constructed in IC structure can be reduced.

As described above, since the magnitude of the currents flowing from the input terminals A to $\overline{D}$ of the decoder 22 to the counter 21 can be reduced, the operation of the circuit can be stabilized and the breakdown voltage can be raised to widen the range of the operating voltage. Further, the chip size of the IC can be reduced.

Figure 21:
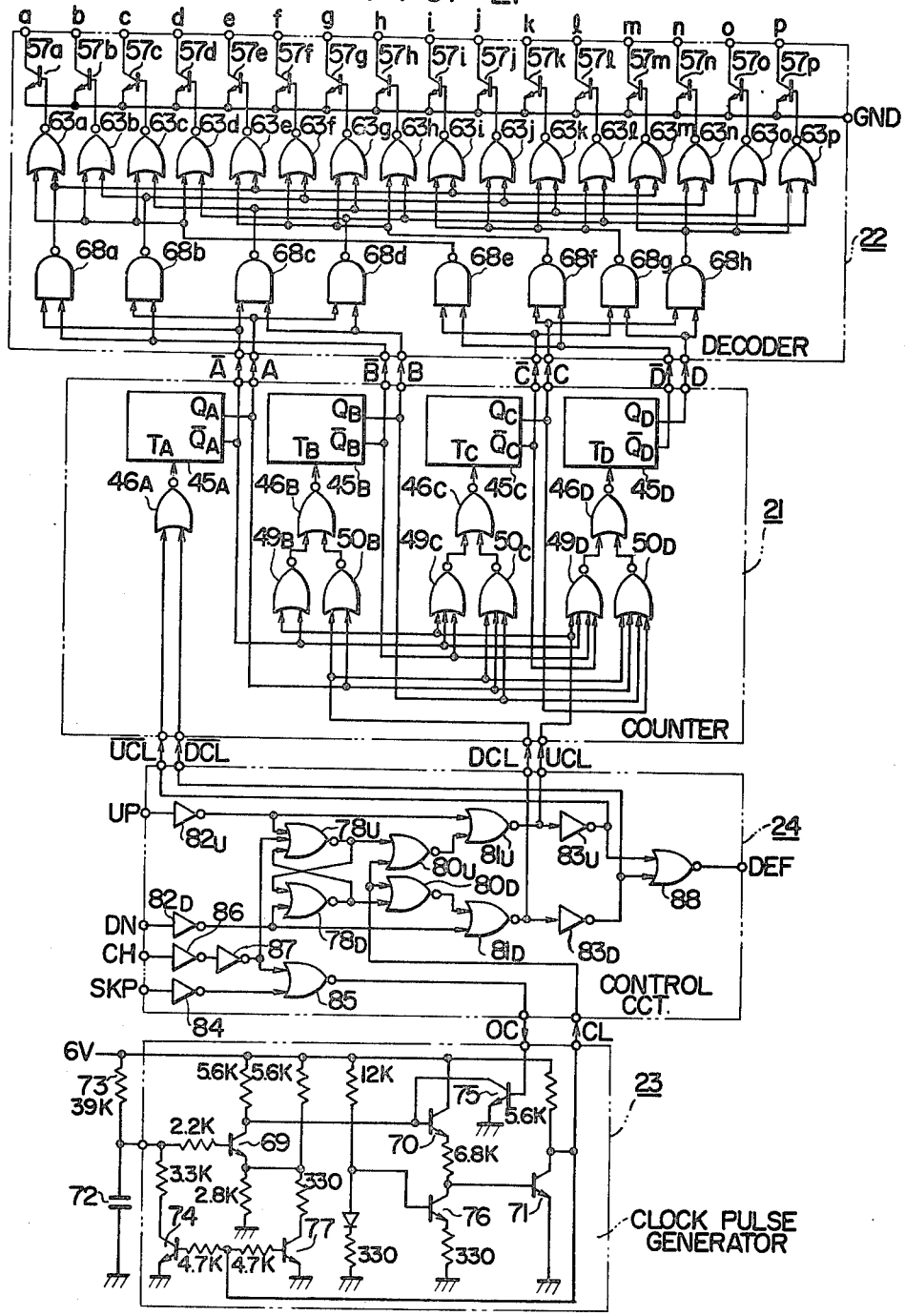
FIG. 21 shows a circuit diagram of a portion of the channel selection apparatus in accordance with one embodiment of the present invention.
Figure 26:
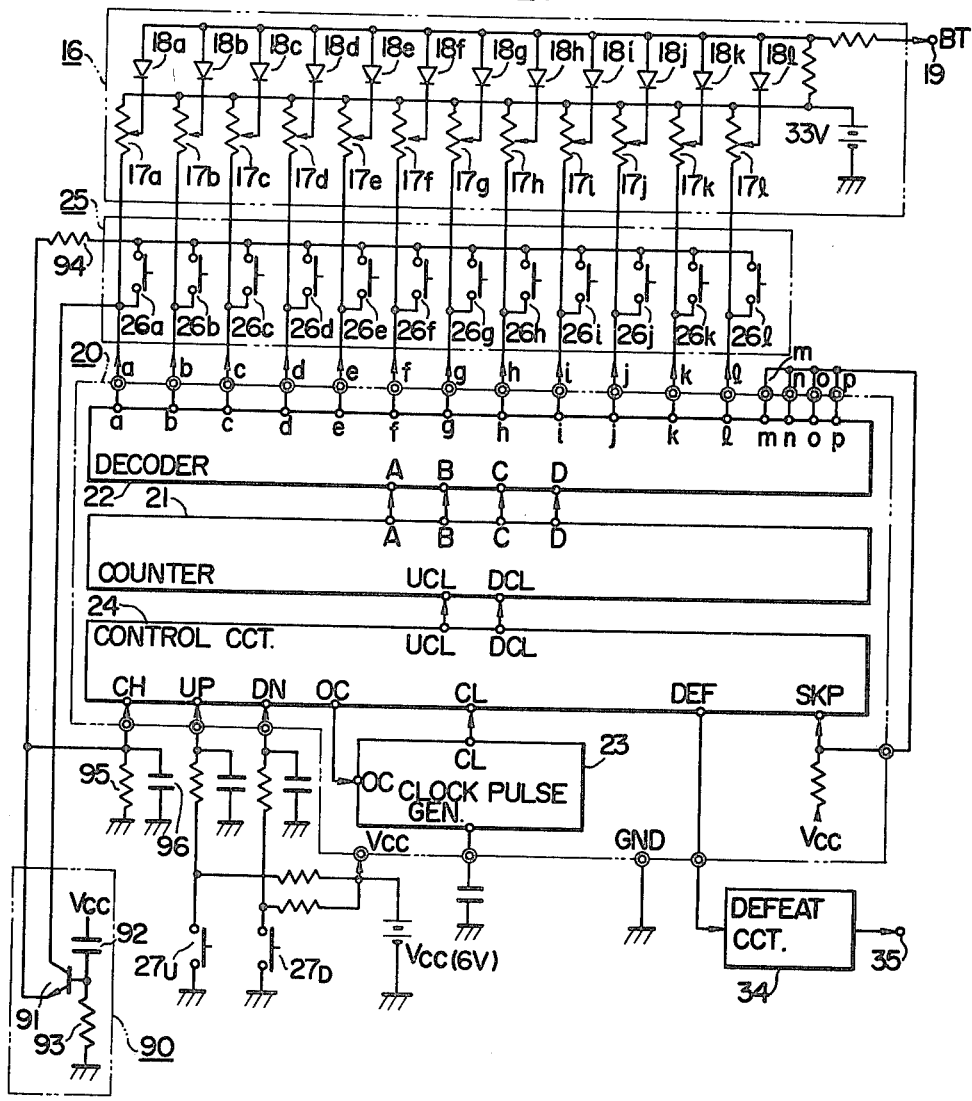
FIGS. 26 and 27 show circuit diagrams of channel selection apparatus in accordance with other embodiments of the present invention.
Figure 27:
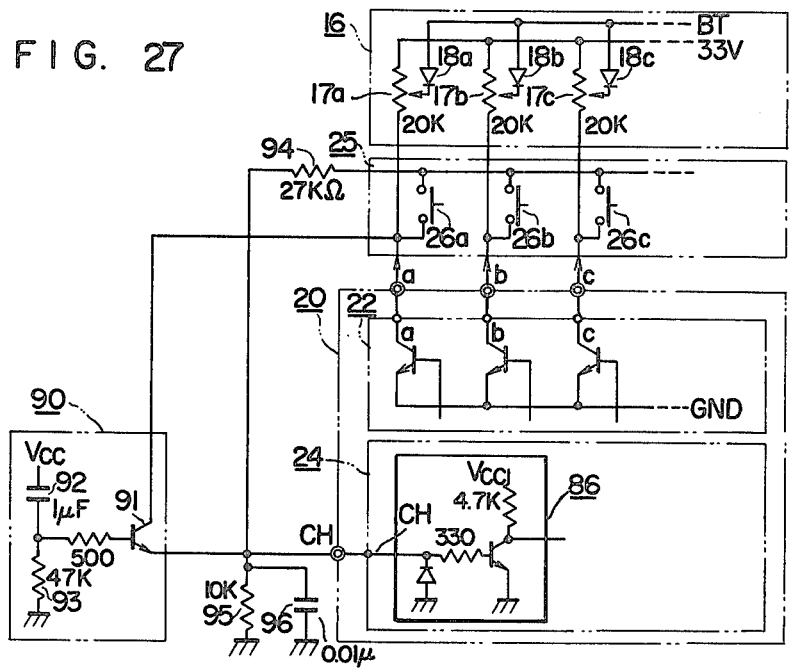

FIG. 21 shows a configuration of a portion of one embodiment of the present invention which combines the counter 21 and the decoder 22 into a channel selection apparatus as shown in FIG. 2. The portion shown in FIG. 21 corresponds to the channel selection circuit 21 in FIG. 2, and the remaining portions are identical to those of FIG. 2 and hence they are not shown. In the present embodiment, the counter 21 shown in FIGS. 8 and 9 and the decoder 22 shown in FIGS. 19 and 20 are used. Although the decoder 22 can produce sixteen different outputs a to p, twelve (a to l) of them are used here to select one of twelve channels, and if the output is produced at any of the four output terminals m to p, it is automatically skipped.

First, a pulse generating circuit 23 which generates clock pulses to be applied to the counter 21 as the count input during the channel selection operation, is explained. The pulse generating circuit 23 is characterized in that it is constructed only by NPN transistors. When the circuit is constructed in IC structure, the PNP transistor requires more manufacturing steps than the NPN transistor. Therefore, it is advantageous in the manufacture to construct the circuit by the NPN transistors only. In FIG. 21, three transistors 69, 70 and 71 are connected in sequence. Connected to the base of the transistor 69 are a capacitor 72 and a resistor 73 for determining an oscillation frequency and an oscillation controlling transistor 74. The collector of the transistor 69 and the base of the transistor 70 are connected together and grounded through an oscillation controlling transistor 75. The emitter of the transistor 69 is connected to the base of the transistor 71 and grounded through a constant current transistor 76. The clock pulses generated from the collector of the transistor 71 are taken from an output terminal CL, which output is also applied to the base of the transistor 74 and to a base of a transistor 77 connected to the emitter of the transistor 69. An oscillation control signal which assumes low level when the oscillation is to take place is applied to the base of the transistor 75 through an input terminal OC.

In the arrangement described above, if the oscillation control signal applied to the input terminal OC is at high level, the transistor 75 conducts so that the transistors 70 and 71 are cut off to produce high level output at the output terminal CL, and the transistor 74 conducts to maintain the capacitor 72 discharged, and the transistor 69 is cut off. This condition is maintained so that the oscillation is kept stopped.

On the other hand, when the oscillation control signal applied to the input terminal OC assumes low level (at time $t_o$ in FIG. 22), the transistor 75 is cut off. Since the transistor 69 has been cut off, the transistors 70 and 71 conduct so that the output at the output terminal CL assumes low level as shown in FIG. 22a. As a result, the transistor 74 is cut off and the capacitor 72 starts to be charged through the resistor 73 so that the base voltage of the transistor 74 rises as shown by a solid line in FIG. 22b. Since the transistor 77 is non-conductive at this time, the emitter voltage of the transistor 69 assumes a relatively high level $V_h$ as shown by a broken line in FIG. 22b. When the base voltage of the transistor 77 rises to a level $V_H$ which is higher than the emitter voltage by a contact voltage difference $V_{BE}$, the collector voltage changes to low level. As a result, the transistors 70 and 71 are again cut off and the output at the output terminal CL assumes high level. Since the transistor 74 conducts, the capacitor 72 starts to discharge through the transistor 74 and the base voltage of the transistor 69 falls. Since the transistor 77 also conducts simultaneously with the transistor 74, the emitter voltage of the transistor 69 is lowered to a relatively low level $V_l$ as shown by a broken line and the transistor 69 remains conductive until the base voltage thereof reaches the level $V_L$ which is higher than the emitter voltage by $V_{BE}$. When the base voltage reaches the level $V_L$, the transistor 69 is cut off so that the transistors 70 and 71 conduct and the transistors 74 and 77 are cut off and the capacitor 72 again starts to be charged. Thereafter, the above operation is repeated to carry out the oscillation. So long as the oscillation control signal 75 is at low level, the oscillation output or the clock pulses as shown in FIG. 22a are produced at the output terminal CL, and when the oscillation control signal assumes high level, the oscillation is stopped. When the circuit constants as indicated in FIG. 21 are employed, the repetition frequency of the clock pulses is approximately 2 KHz.

A control circuit 24 which receives the clock pulses thus generated to drive the counter 21 to select the channel is now explained. As described above, the channel selection apparatus of FIG. 21 uses only twelve output terminals a to l of the decoder 22, and when an output is produced at any of the four output terminals m to p, the clock pulses are automatically generated to drive the counter 21 to skip the output. As described above in conjunction with the explanation of the counter 21, since the counter 21 starts the counting operation at the trailing edge of the count input, means is required, when the jump occurs from the output terminal l to the output terminal a in the count-up operation or when the jump occurs from the output terminal a to the output terminal l in the count-down operation, to memorize whether the jump occurred during the count-up operation or during the count-down operation in order to control the counting operation. In FIG. 21, a flip-flop 79 comprising NOR gates 78U and 78D in the control circuit 24 and NOR gates 80U, 80D, 81U and 81D function for that purpose. The low level input applied to the input terminal UP when the count-up switch 27U is actuated is inverted by an inverter 82U, an output of which is applied to the NOR gates 78U and 81U, and the low level input applied to the input terminal DN when the count-down switch 27D is actuated is inverted by an inverter 82D, an output of which is applied to NOR gates 78D and 81D. The output of the flip-flop 79 is applied to the NOR gates 80U and 80D to gate the clock pulses which are applied from the pulse generating circuit 23 to the input terminal CL, and the output of the flip-flop 79 is also combined with the outputs of the inverters 82U and 82D at the NOR gates 81U and 81D and the resulting outputs at the output terminals UCL and DCL are applied to the counter 21 as the count input thereto. The outputs of the NOR gates 81U and 81D are inverted by the inverters 83U and 83D, the outputs of which are applied from output terminals $\overline{UCL}$ and $\overline{DCL}$ to the counter 21 as the count input thereto.

In order to activate the pulse generating circuit 23 during the manual channel selection operation and the jump operation, the input applied from the channel selection switches 26a to 26l to the input terminal CH and the output of the inverter 84 to which the input applied from the output terminals m to p of the decoder 22 to the input terminal SKP is applied, are applied to the pulse generating circuit 23 as the oscillation controlling signal thereto from the output terminal OC through the NOR gate 85. Numeral 86 and 87 denote buffer amplifiers.

The channel selection operation by the arrangement described above is explained below. Assume that the outputs of the flip-flops 45A to 45D in the counter 21 are "0000", the transistor 57a in the decoder 22 is conducting, and the terminal a produces the low level output while the other terminals b to p produce the high level outputs. Under these conditions, a current flows through the potentiometer 17a so that the channel selection voltage set by the potentiometer 17a is taken to select the channel a.

Under this condition, when the up channel selection switch 27U of the sequential channel selection switches 27U and 27D is closed by remote control operation or manual operation, the input to the terminal UP changes to the low level at the time $t_1$ of actuation, as shown in FIG. 23a. As a result, the output of the inverter 82U assumes the high level to set the flip-flop 79 to a first state. The first state here is defined as a state in which the output of the NOR gate 78U is at the low level as shown in FIG. 23b and the output of the NOR gate 78D is at the high level. The opposite state is defined as a second state. In response to the first state output, the output of the NOR gate 80U assumes the high level as shown in FIG. 23C to gate the input a from the NOR gate 80U to the terminal UP to produce an output as shown in FIG. 23d. This output is inverted by the inverter 83U as shown in FIG. 23e. Those outputs are applied from the terminals UCL and $\overline{UCL}$ to the counter 21 as the count-up signal.

The counter 21 is triggered by the trailing edge of the count input, as described above. In the present embodiment, therefore, it is triggered by the trailing edge of the input a to the terminal UP, that is, at the time $t_2$ when the switch 27U has been actuated and opened, to increment the content thereof by one to produce an output "1000" so that the output of the decoder 22 is moved to the terminal b to select the channel b. In a similar manner, each time the up channel selection switch 27U is actuated, the counter 21 is incremented by one at the trailing edge of the actuation so that the channel c, channel d, . . . channel l are selected sequentially one at a time. The flip-flop 7a assumes the second state when the down channel selection switch 27D is next actuated, e.g. at the time $t_3$.

When the terminal l of the decoder 22 produces the output to select the channel l, if the up channel selection switch 27U is actuated at the time $t_4$, an output is produced from the next terminal m at the time $t_5$. Since the terminals m to p are not used in the present apparatus but should be skipped, the low level outputs produced at the terminals m to p at this time are applied to the terminal SKP of the control circuit 24, as shown in FIG. 23f. Thus, the output of the inverter 84 assumes the high level and the NOR gate 85 produces the low level oscillation control signal as shown in FIG. 23g, which is applied from the terminal OC to the pulse generating circuit 23 to start the oscillation operation. As a result, the pulse generating circuit 23 produces the clock pulses as shown in FIG. 23h at the terminal CL. There is slight delay, however, before the oscillation takes place. The clock pulses pass through the NOR gates 80U and 81U and the inverter 83U in the control circuit 24 as shown in FIGS. 23c, 23d and 23e and are applied from the terminals UCL and $\overline{UCL}$ to the counter 21 as the count-up signal. Consequently, the counter 21 automatically counts up and sequentially produces outputs at the terminals n, o, p of the decoder 22. Since the outputs at the terminals n, o, p are also applied to the terminal SKP, the oscillation control signal shown in FIG. 23g continues to be generated so long as the output is produced from those terminals so that the clock pulses are continuously generated as shown in FIG. 23h. At the time $t_6$, when the count output of the counter 21 returns to "0000" and the decoder 22 produces the output at the terminal a, the input f to the terminal SKP disappears and the oscillation control signal g also disappears. As a result, the pulse generating circuit 23 stops to generate the clock pulses h. Thus, the count operation of the counter 21 is stopped and the channel a is selected. In this manner, the automatic skip from the channel l to the channel a takes place during the upward sequential channel selection operation.

The downward sequential channel selection operation is now explained with reference to FIG. 24. The operation is basically identical to the upward sequential channel selection operation described above. When the channel selection switch 27D is closed at the time $t_1$, the input to the terminal DN assumes the low level as shown in FIG. 24a and the output of the inverter 82D assumes the high level so that the flip-flop 79 is set to the second state. Accordingly, the output of the NOR gate 78D assumes the low level as shown in FIG. 24b, and the output of the NOR gate 80D changes as shown in FIG. 24c, the output of the NOR gate 81D changes as shown in FIG. 24d and the output of the inverter 83D changes as shown in FIG. 24e and they are applied from the terminals DCL and $\overline{DCL}$ to the counter 21 as the count-down signal. As a result, if the channel 1 has been selected before the time $t_1$, the channel k is selected at the time $t_2$. In a similar manner, each time the down channel selection switch 27D is actuated, the channels k, j, i, . . . are selected downward one at a time.

When the channel a has been selected, if the down channel selection switch 27D is actuated at the time $t_4$, the input is applied to the terminal SKP as shown in FIG. 24f during the time period of $t_5$ to $t_6$ during which the outputs are produced at the terminals p to m, so that the oscillation control signal g is generated to produce the clock pulses as shown in FIG. 24h. These clock pulses are applied to the counter 21 as the count-down signal through the NOR gates 80D and 81D and the inverter 83D so that the next channel l is automatically selected.

The operation in which the channel to be selected is directly designated by the actuation of the switch board 25 is explained with reference to FIG. 25.

Again, assume that the channel a has been initially selected. Under this condition, if a switch 26i of the switch board 25 is actuated at the time $t_1$ to select the channel i, the output at the terminal i for the channel i is the decoder 22 is at the high level and it is applied to the terminal CH of the control circuit 25 as shown in FIG. 25a. The input to the terminal CH is shaped by two inverters 86 and 87 and the applied to the NOR gate 78U. As a result the flip-flop 79 is set to the first state and the output of the NOR gate 78U assumes the low level as shown in FIG. 25b. This condition is the same as that of the upward sequential channel selection. Consequently, in case of the direct channel selection, the counter 21 is controlled in the count-up direction only.

On the other hand, since the input a to the terminal CH is also applied to the NOR gate 85, the output thereof assumes the low level as shown in FIG. 25c so that the oscillation control signal is applied to the pulse generating circuit 23 from the terminal OC. As a result, the pulse generating circuit 23 is activated to produce the clock pulses as shown in FIG. 25d at the terminal CL thereof. The clock pulses d pass though the NOR gates 80U and 81U and the inverter 83U as shown in FIGS. 25e, 25f and 25g, respectively, and applied to the counter 21 as the count-up signal from the terminals UCL and $\overline{UCL}$. As a result, the counter 21 counts in upward direction to select the channels in the order of a, b, c, . . . At the time $t_2$, when the count corresponding to the channel i has been counted, the output at the terminal i assumes the low level as shown in FIG. 25a so that the input to the terminal CH assumes the low level as shown in FIG. 25b, and the oscillation control signal shown in FIG. 25c also assumes the low level. Accordingly, the generation of the clock pulses from the pulses generating circuit is stopped and no further counting operation takes place. In this manner, the channel i is kept selected, and the channel i is directly selected. The same is true for the other channels.

If the frequency of the clock pulses is selected to be sufficiently high, the above channel selection operation can be completed instantaneously during the actuation of the switches 26a to 26l.

When the channel k has been selected, if it is desired to directly select the channel c, the distance between the terminals m and p of the decoder must be skipped. The skip operation is similar to the operation in the count-up mode so that the channels k, l, a, b and c are automatically selected in this sequence.

In this manner, the sequential channel selection and the direct channel selection, either upward or downward, can be satisfactorily carried out in the present apparatus.

In FIG. 21, the NAND gate 88 in the control circuit 24 functions to generate a defeat signal at a terminal DEF during the channel selection operation.

While the flip-flops and the gates are used in the above embodiment as means for controlling the count-up and count-down modes of the counter, it should be noted that any other circuits which have similar function may be used.

As described hereinabove, according to the present invention, the channel selection apparatus which is exact in operation, can select the channel in a stable manner and is easy to manufacture can be provided.

Referring now to FIGS. 26 to 31, an embodiment of the present apparatus which can select a predetermined channel upon power-on without increasing the number of pins in the IC structure. Since the present embodiment is same as those shown in FIGS. 1 to 25 except an initial channel setting circuit, the like reference numerals are used to designate the like parts and the explanations thereof are omitted here. The present embodiment is designed such that the channel a is always selected upon power-on. To this end, the initial channel setting circuit 90 comprises a transistor 91 which is connected in parallel with the channel selection switch 26a for selecting the channel a, and a time constant circuit having a capacitor 92 and a resistor 93 connected to the base of the transistor 91 to render the transistor 91 conductive for a give time period (e.g. about 100 mseconds) upon power-on. Numerals 94, 95 and 96 denote resistors and capacitor which constitute a filter circuit for preventing noise from being introduced and which is connected between the switches 26a to 26l and the terminal CH.

With this arrangement, when the power is turned on, the transistor 91 conducts for the given time period. This is equivalent to the closure of the channel selection switch 26a. Therefore, even if the content of the counter 21 immediately after the power-on indicate the selection of channel other than the channel a, the same channel selection operation as the direct channel selection operation described above takes place because the transistor 91 conducts, so that the channel a is forcibly selected. Since the above operation takes place immediately after power-on, a viewer feels as if the channel a has been selected at the time of power-on so that the viewer has a stable feeling that the channel a is always selected upon power on.

Figure 28:
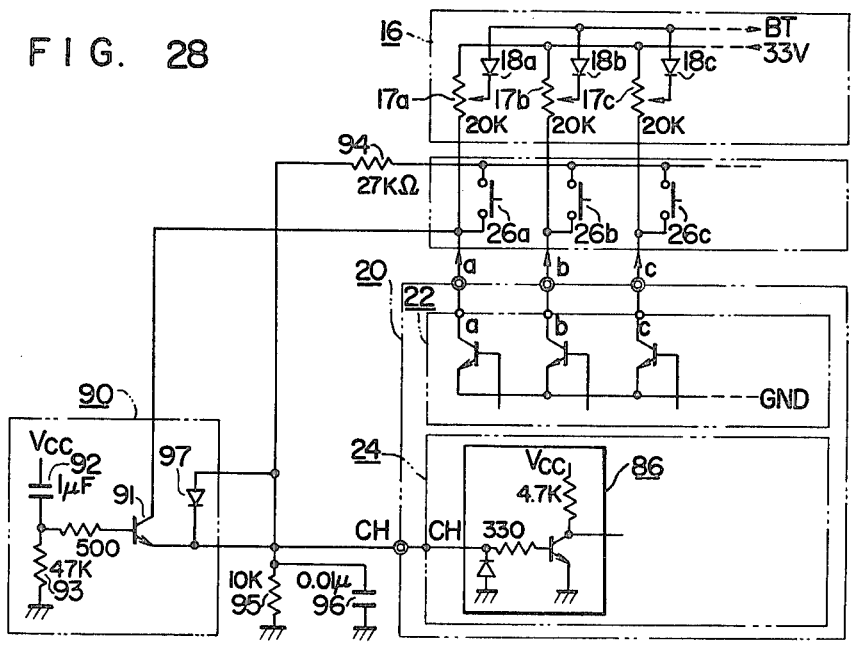
FIGS. 28 to 31 show circuit diagrams of portions of channel selection apparatus in accordance with other embodiments of the present invention.

FIG. 28 shows another embodiment, which further assures the above operation immediately after power-on. As described above, in order to control the control circuit after power-on, the transistor 91 is rendered conductive for the given time period determined by the time constant of the time constant circuit comprising the capacitor 92 and the resistor 93 connected to the base of the transistor 91, to apply the drive current to the terminal CH. In order to control the control circuit 24, a drive current of higher than a predetermined level is required, and it is necessary to maintain the current of higher than the predetermined level for longer than a predetermined time period in order to drive the circuit to the channel a. However, if the time constant of the time constant circuit connected to the base of the transistor 91 is increased to maintain the drive current from the transistor 91 over an extended period, the supply period of the drive current is short if the power switch is turned on and off at a short interval so that the operation may become unstable. In the circuit of FIG. 28, instead of increasing the time constant of the time constant circuit, the filter circuit for preventing noise from being introduced connected between the switches 26a to 26l and the terminal CH is connected to the terminal CH through the diode 97 to eliminate erroneous operation. If the diode 97 is absent, the current from the transistor 91 branches into the terminal CH and the resistor 95 of the filter circuit so that the current may early fall below the minimum drive current. When the diode 97 is present, the branching current to the resistor 95 can be inhibited so that the drive current applied to the control circuit 24 can be kept above the predetermined level over an extended time period.

Figure 29:
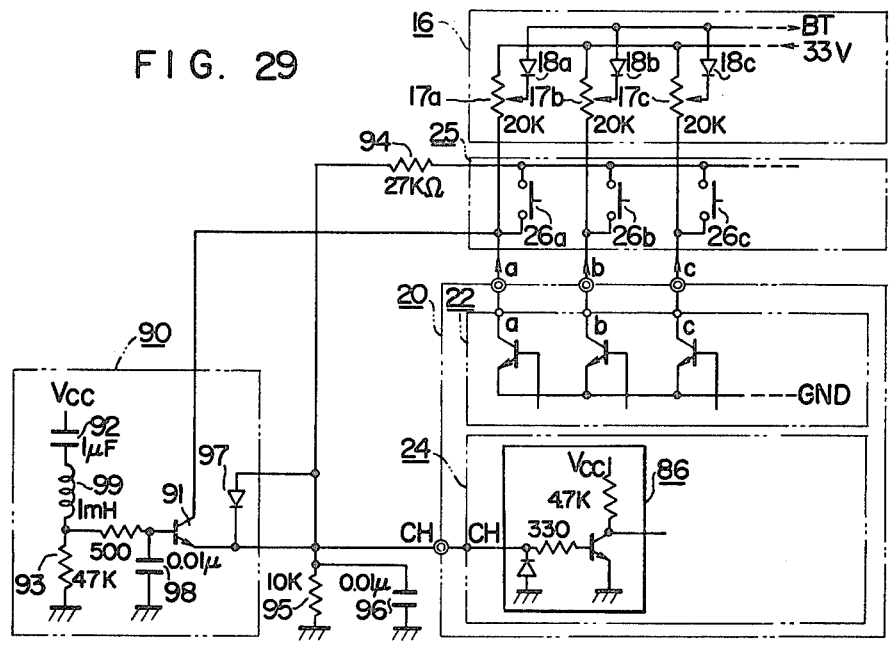

FIG. 29 shows an embodiment which prevents the introduction of noise from the initial channel setting circuit 86. A noise bypassing capacitor 98 is connected to the base of the transistor 91, and a coil 99 is connected in series with the capacitor 92 to prevent the noise from being introduced from the power supply. Since many of the noise introduced from the power supply include high frequency components, they can be fully blocked if the constants of the capacitor 98 and the coil 99 are selected properly, and the affect to the operation of the time constant circuit upon power-on by the insertion of the coil 99 can be substantially eliminated. Only one of the capacitor 98 and the coil 99 will be needed, as a case may be.

Figure 30:
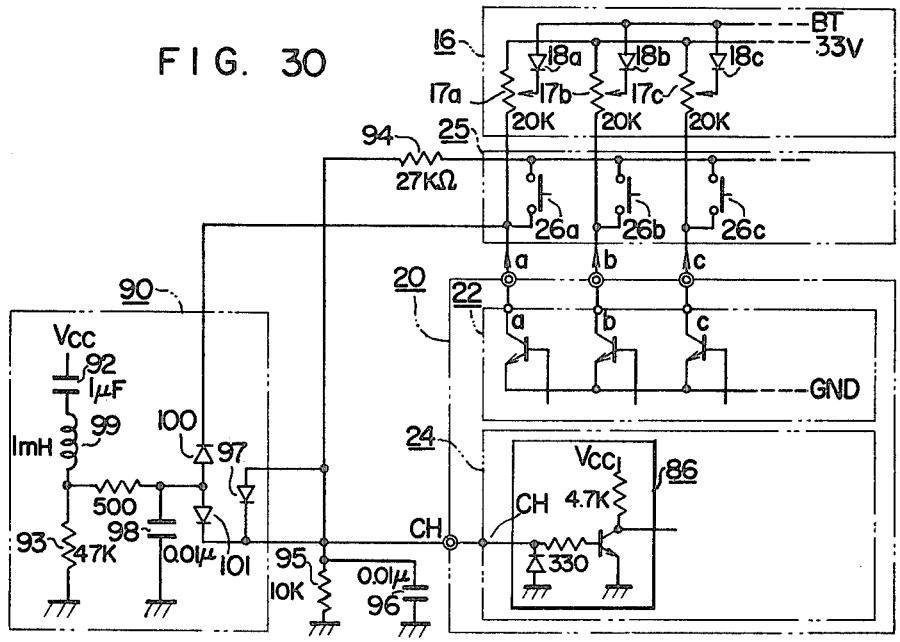

While the transistor is used in the above embodiment as the switching device for the initial channel setting circuit 90, diodes 100 and 101 which are connected series opposing as shown in an embodiment of FIG. 30 may be used with the opposite ends thereof being connected to the switches 26a to 26l and the terminal CH, and the center point thereof being connected to the time constant circuit.

In the configurations described above, since the initial channel setting circuit 90 is connected to the channel selection switch 26a which is connected externally of the electronic switching circuit, there is no need to modify the channel switching circuit 5. Thus, when the circuit encircled by a dot and dash line is implemented in IC structure, there is no need to increase the number of terminal pins and the modification of the external circuit only is required. Accordingly, there is no trouble in implementing the circuit in the IC structure and the present invention contributes very much to the implemention of the circuit in the IC structure.

The initial channel setting circuit 90 may be constructed differently than that shown in the above embodiment so long as it is switched for the give time period after power-on, and if it is desired to initially set a channel other than the channel a, the channel selection switch corresponding to the desired channel may be connected.

The initial channel setting circuit of the above embodiment uses the element which is rendered conductive for the given time period after power-on and which is connected in parallel with the channel selection switch since the channel selection switch is of normally open type which is closed during the channel selection operation. However, if the channel selection switch is of normally close type, the initial channel setting circuit must use an element which is rendered non-conductive for the given time period after power-on and which is connected in series with the channel selection switch. In any case, the circuit which brings about the same effect as of the channel selection switch is actuated for the given time period after power-on may be used.

Figure 31:
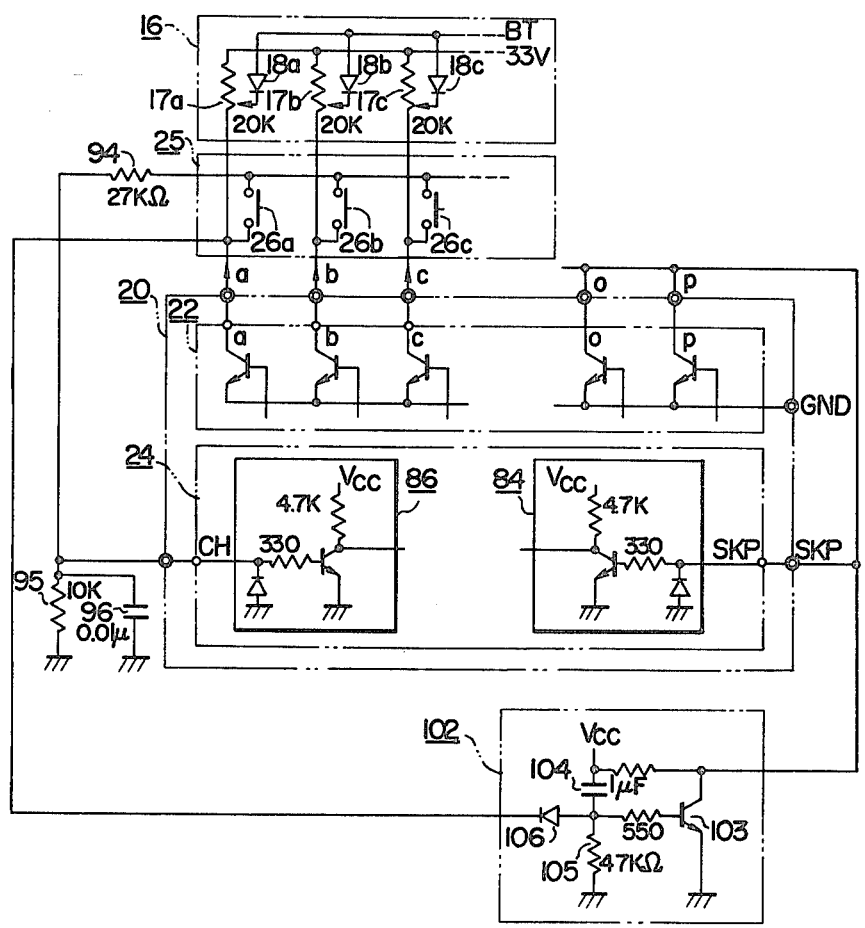

Finally, referring to FIG. 31, another embodiment of the initial channel setting circuit is explained.

In the present embodiment, an initial channel setting circuit 102 is provided, in which a transistor 103 as a switching device is connected between the input terminal SKP for the skip signal to the control circuit 24 in the channel control circuit 20 and ground. Connected to the base of the transistor 103 are a time constant circuit comprising a capacitor 104 and a resistor 105 to render the transistor 103 conductive for the given time period (e.g. 100 m seconds) after power-on, and the base is also connected to a channel to be initially set, or the input terminal a of the channel Q is the illustrated example, through a diode 106.

With the above arrangement, immediately after power-on, the transistor 108 conducts for the given time period determined by the time constant circuit of the capacitor 104 and the resistor 105 to cause the input terminal SKP of the control circuit 24 to assume the low level. As described above, since this condition is same as the conduction in which the low level outputs appear at the output terminals m to p of the decoder 22 to carry out the skipping operation, the control circuit 24 produces the oscillation control voltage so that the pulse generating circuit 23 generates the clock pulses, which are counted by the counter 21 to switch the outputs from the decoder 22. When the predetermined channel or the channel a is selected, the output at the output terminal a assumes the low level so that the transistor 103 is cut off to change the input to the input terminal SKP to the high level to stop the channel selection operation. In this manner, immediately after power-on, the similar operation to the skipping channel selection operation occurs automatically so that the predetermined channel a is selected. Since this operation takes place is a very short time period, the viewer feels as if the channel a is always selected upon power-on.

Another advantage of the present apparatus lies in that it is realized only by connecting the initial channel setting circuit 102 to the existing terminals SKP and a. Consequently, when the circuit portion encircled by a chain line is impelemented by the IC structure, there is no need of increasing the number of terminal pins. Thus, the apparatus is most suitable for implementing in the IC structure.

While the above embodiment is designed such that the channel a is selected upon power-on, if other channel is to be initially set, the diode 106 may be connected to the output terminal of the corresponding channel. Any switch element other than the transistor 103 may be used so long as the circuit is designed such that the similar condition to the skipping operation is brought about for the given time period after power-on.

What is claimed is:
1. A channel selection apparatus comprising:
  a tuner having a voltage dependent variable reactance element as a tuning element;
  a plurality of potentiometers for presetting channel selection voltages one for each of a plurality of channels, said channel selection voltages being selectively applied to said variable reactance element of said tuner for selecting a disired channel;
  a coupling means for coupling selected one of said potentiometers to said turner such that one of said channel selection voltages taken from said selected potentiometer is applied to said variable reactance element of said tuner;
  a counter including a plurality of flip-flops and connecting means for cascade-connecting said plurality of flip-flops such that a trailing edge of an AND output of an output of the flip-flop in one stage and a channel selection count input signal triggers the flip-flop of the next stage;
  a clock pulse generating circuit for generating clock pulses;
  a control circuit responsive to a channel selection control input applied to an input terminal thereof to extract said clock pulses and couple said counter to said clock pulse generating circuit such that said extracted clock pulses are applied to said counter as said count input signal;
  a decoder including binary signal input terminals, a plurality of output terminals said decoder being responsive to said binary signal to produce an output at one of said output terminals, a plurality of output transistors connected to said plurality of output terminals, respectively, a plurality of parallel-connected transistor sets, means for coupling the bases of said output transistors to the common collectors of the respective ones of said transistor sets, and means for coupling said binary signal input terminals to the bases of the respective ones of said transistor sets;
  a coupling means for coupling said output terminals of said decoder to said potentiometers to select one of said plurality of potentiometers in accordance with the output of said decoder; and
  a switch means connected to said input terminal of said control circuit to apply said channel selection control input to said input terminal.

2. A channel selection apparatus according to claim 1, wherein said counter includes a plurality of flip-flops, NOR gates each having an output terminal thereof connected to a trigger input terminal of corresponding one of said flip-flops, AND gate pairs each pair having output terminals thereof connected to input terminals of the NOR gates connected to the second stage and following stage flip-flops, means for supplying a count-up signal to the NOR gate connected to the first stage flip-flop and first gates of said AND gate pairs, means for supplying a count-down signal to said NOR gate connected to the first stage flip-flop and second gates to said AND gate pairs, and means for supplying to the AND gate pairs of outputs of the flip-flops of all of the preceeding stages.

3. A channel selection apparatus according to claim 1, wherein said counter includes a plurality of flip-flops, NOR gates each having an output terminal thereof connected to a trigger input terminal of corresponding one of said flip-flops, NOR gate pairs each pair having output terminals thereof connected to input terminals of the NOR gates connected to the second stage and following stage flip-flops, means for supplying a count-up signal and a count-down signal to the NOR gate connected to the first stage flip-flop, means for supplying an inverted version of said count-up signal to first gates of said NOR gate pairs, means for supplying an inverted version of said count-down signal to second gates of said NOR gate pairs, and means for supplying to the NOR gate pairs the outputs of the flip-flops of all of the preceeding stages.

4. A channel selection switch comprising;
a tuner having a voltage dependent variable reactance element as a tuning element;
a plurality of potentiometers for presetting channel selection voltages one for each of a plurality of channels, said channel selection voltages being selectively applied to said variable reactance element of said tuner for selecting a desired channel;
a coupling means for coupling selected one of said potentiometers to said tuner such that one of said channel selection voltages taken from said selected potentiometer is applied to said variable reactance element of said tuner;
a counter including a plurality of cascade-connected flip-flops, an input terminal to which channel selection clock pulses to be counted by said flip-flops are applied and a binary output terminal from which a binary signal indicative of the count is taken;
a clock pulses generating circuit for generating clock pulses;
a control circuit responsive to a channel selection control input applied to an input terminal thereof to extract said clock pulses and couple said counter to said clock pulse generating circuit such that said extracted clock pulses are applied to said counter as said count input signal;
a decoder including binary signal input terminals, a plurality of output terminals, said decoder being responsive to said binary signal to produce an output at one of said output terminals, a plurality of output transistors connected to said plurality of output terminals, respectively, a plurality of parallel-connected transistor sets, means for coupling the bases of said output transistors to the common collectors for the respective ones of said transistor sets, and means for coupling said binary signal input terminals to the bases of the respective ones of said transistor sets;
a coupling means for coupling said output terminals of said decoder to said potentiometers to select one of said plurality of potentiometers in accordance with the output of said decoder; and
a switch means connected to said input terminal of said control circuit to apply said channel selection control input to said input terminal.

5. A channel selection apparatus according to claim 4, wherein said means in said decoder for coupling said binary signal input terminals to the bases of said transistor sets includes a plurality of first transistors each having a collector thereof connected to the bases of the corresponding transistor set and an emitter grounded, and a plurality of parallel-connected transistor sets each having common collector thereof connected to the base of corresponding one of said first transistors, common emitter thereof grounded and bases thereof connected to corresponding one of said binary signal input terminals.

6. A channel selection apparatus according to claim 4, wherein said means in said decoder for coupling said binary signal input terminals to the bases of said transistor sets includes a plurality of first transistors each having a collector thereof connected to the bases of the corresponding transistor set and a base thereof connected to corresponding one of said binary signal input terminals, and a plurality of transistors each having a collector thereof connected to the emitter of corresponding one of said first transistors, a base thereof connected to corresponding one of said binary signal input terminals and an emitter thereof grounded.

7. A channel selection apparatus according to claim 4, wherein said counter includes a plurality of flip-flops, NOR gates each having an output tetminal thereof connected to a trigger input terminal of corresponding one of said flip-flops, NOR gate pairs each pair having output terminals thereof connected to input terminals of the NOR gate connected to the second stage and the following stage flip-flops, means for supplying a count-up signal and a count-down signal to the NOR gate connected to the first stage flip-flop, means for supplying an inverted version of said count-up signal to first gates of said NOR gate pairs, means for supplying an inverted version of said count-down signal to second gates to said NOR gate pairs, and means for supplying to the NOR gate pairs the outputs of the flip-flops of all of the preceeding stages.

8. A channel selection apparatus according to claim 4, wherein said counter includes a plurality of flip-flops, NOR gates each having an output terminal thereof connected to a trigger input terminal of the corresponding one of said flip-flops, AND gate pairs each pair having output terminals thereof connected to the input terminals of the NOR gates connected to the second stage and the following stage flip-flops, means for supplying a count-up signal to the NOR gate connected to the first stage flip-flop and the first gates of said AND gate pairs, means for supplying a count-down signal to the NOR gate connected to the first stage flip-flop and the second gates of said AND gate pairs, and means for supplying to the AND gate pairs the outputs of the flip-flops of all of the preceeding stages.

9. A channel selection apparatus according to claim 4, wherein said counter includes a plurality of flip-flops, an input terminal to which channel selection pulses to be counted by said flip-flop are applied, as binary output terminal from which binary signal indicative of the content of said counter is taken, a gate circuit for ANDing the outputs of the flip-flops of preceeding stages and the channel selection clock pulses and means for cascade-connecting said plurality of flip-flops such that the output of said gate circuit is coupled to trigger input terminal of the succeeding stage flip-flop to trigger the succeeding stage flip-flop by the trailing edge of the AND output.

10. A channel selection apparatus according to claim 9, wherein said means in said decoder for coupling said binary signal input terminals to the bases of said transistor sets includes a plurality of first transistors each having a collector thereof connected to the bases of the corresponding transistor set and an emitter grounded, and a plurality of parallel connected transistor sets each having common collector thereof connected to the base of corresponding one of said first transistors, common emitters thereof grounded and bases thereof connected to corresponding one of said binary signal input terminals.

11. A channel selection apparatus according to claim 9, wherein said means in said decoder for coupling said binary signal input terminals to the bases of said transistor sets includes a plurality of first transistors each having a collector thereof connected to the bases of the corresponding transistor set and a base thereof connected to corresponding one of said binary signal input terminals, and a plurality of transistors each having a collector thereof connected to the emitter of corresponding one of said first transistors, a base thereof connected to corresponding one of said binary signal input terminals and an emitter thereof grounded.

12. A channel selection apparatus according to claim 9, wherein said counter, said decoder, said clock pulse generating circuit and said control circuit are incorporated in a semiconductor integrated circuit, and said switch means is connected to the output terminal pins and the input terminal pins mounted on said semiconductor integrated circuit.

13. A channel selection apparatus according to claim 9, further comprising:
 a plurality of channel selection switches connected between the plurality of output terminals of said decoder and the input terminal of said control circuit, and
 an initial channel setting circuit connected to one of said plurality of switches and being operable to bring about the same condition as if said one switch were actuated, for a predetermined time period after power-on.

14. A channel selection apparatus according to claim 9, further comprising:
 a plurality of channel selection switches connected between the plurality of output terminals of said decoder and the input terminal of said control circuit;
 an initial channel setting circuit connected to one of said plurality of switches and being operable to bring about the same condition as if said one switch were actuated, for a predetermined time period after power-on;
 a filter circuit for preventing the introduction of noise;
 means for coupling said filter circuit to the input terminal of said control circuit through a diode; and
 means for connecting said initial channel setting circuit directly to said input terminal of said control circuit.

15. A channel selection apparatus according to claim 9, further comprising:
 a plurality of channel selection switches connected between the plurality of output terminals of said decoder and the input terminal of said control circuit;
 a switching element connected to one of said switches; and
 a time constant circuit connected to said switching element and operable to switch said switching element for a predetermined time period after power-on for causing said switch element to assume the same condition as if said switch were actuated.

16. A channel selection apparatus according to claim 9, further comprising;
 a plurality of channel selection switches connected between the plurality of output terminals of said decoder and the input terminal of said control circuit;
 a switching element connected to one of said switches;
 a time constant circuit connected to said switching element and operable to switch said switching element for a predetermined time period after power-on for causing said switch element to assume the same condition as if said switch were actuated; and
 a filter circuit for preventing the introduction of noise connected to said time constant circuit.

17. A channel selection apparatus according to claim 9, further comprising:
 a plurality of channel selection switches connected between the plurality of output terminals of said decoder and the input terminal of said control circuit;
 a series-connected diode circuit having a series-opposing connected diode pair and connected to one of said switches; and
 a time constant circuit connected to the center point of said series-connected diode circuit to switch said diode pair for a predetermined time period after power-on to cause said diode pair to assume the same condition as if said switch were actuated.

18. A channel selection apparatus according to claim 4, wherein said control circuit has a skip-control terminal to which a control signal is applied to sequentially switch the outputs from the output terminals of said decoder while skipping the output terminals producing the outputs, the clock pulses from said clock pulse generating circuit being applied to said counter while said control signal is being applied to said skip-control signal, and further including as intial channel setting circuit having a switching element and a time constant circuit for producing a signal equivalent to said skip control signal for a predetermined time period after power-on and applying said equivalent signal to said skip control terminal, and output terminal of said initial channel setting circuit being connected to said skip control terminal, a control terminal of said switching element being connected to one of the output terminals of said decoder.

* * * * *